US010567688B2

(12) United States Patent
Lee et al.

(10) Patent No.: US 10,567,688 B2
(45) Date of Patent: Feb. 18, 2020

(54) IMAGE SENSOR WITH TEST LIGHT SHIELDING PATTERN, IMAGING DEVICE, AND METHOD OF MANUFACTURING IMAGE SENSOR CHIP PACKAGE

(71) Applicant: SAMSUNG ELECTRONICS CO., LTD., Suwon-si (KR)

(72) Inventors: Jun-taek Lee, Hwaseong-si (KR); Yun-jeong Kim, Seoul (KR); Sun-yong Park, Seoul (KR); Goon-suk Jang, Suwon-si (KR); Jeong-seob Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/107,403

(22) Filed: Aug. 21, 2018

(65) Prior Publication Data
US 2019/0215472 A1    Jul. 11, 2019

(30) Foreign Application Priority Data

Jan. 10, 2018  (KR) .................. 10-2018-0003350

(51) Int. Cl.
| | |
|---|---|
| *H04N 5/374* | (2011.01) |
| *H01L 25/16* | (2006.01) |
| *H01L 27/146* | (2006.01) |
| *H04N 5/341* | (2011.01) |
| *H04N 5/369* | (2011.01) |

(52) U.S. Cl.
CPC ........... *H04N 5/374* (2013.01); *H01L 25/167* (2013.01); *H01L 27/14605* (2013.01); *H01L 27/14607* (2013.01); *H01L 27/14623* (2013.01); *H01L 27/14643* (2013.01); *H04N 5/341* (2013.01); *H04N 5/3696* (2013.01); *H01L 27/14621* (2013.01); *H01L 27/14627* (2013.01)

(58) Field of Classification Search
None
See application file for complete search history.

(56) References Cited

U.S. PATENT DOCUMENTS 7,591,966 B2    9/2009  Lee et al.
7,875,488 B2    1/2011  Hong et al.
(Continued)

FOREIGN PATENT DOCUMENTS

| JP | 2004252064 A | * | 9/2004 | ............... G03F 1/08 |
|---|---|---|---|---|
| KR | 10-0725366 B1 | | 6/2007 | |

(Continued)

OTHER PUBLICATIONS

Okabe et al., JP 2004252064 A, Reticle and Exposure Method of Semiconductor Wafer, Sep. 2004, pp. 1-2; English Translation (Year: 2004).*

*Primary Examiner* — Cynthia Segura
(74) *Attorney, Agent, or Firm* — Sughrue Mion, PLLC

(57) ABSTRACT

An image sensor, imaging device, and method are provided. The image sensor includes a pixel array including an active area in which plural active pixels are located, and a dummy area in which plural dummy pixels are located, and a test element group (TEG) which is located in the dummy area and on which a test light-shielding pattern, different from a light-shielding pattern formed on the active area, is formed to detect a degree of misalignment between the light-shielding pattern and the active area.

16 Claims, 19 Drawing Sheets

(56) References Cited

U.S. PATENT DOCUMENTS

| | | | |
|---|---|---|---|
| 7,906,258 B2 | 3/2011 | Komine et al. | |
| 8,017,426 B2 | 9/2011 | Brady | |
| 8,205,507 B2 | 6/2012 | Eckert et al. | |
| 9,855,618 B2 | 1/2018 | Yu et al. | |
| 2004/0184131 A1* | 9/2004 | Kurashina | G02F 1/136259 359/245 |
| 2004/0217397 A1* | 11/2004 | Lee | H01L 22/34 257/292 |
| 2005/0285166 A1 | 12/2005 | Lee et al. | |
| 2006/0057478 A1 | 3/2006 | Kwon et al. | |
| 2006/0060955 A1* | 3/2006 | Kummerl | H01L 25/167 257/686 |
| 2007/0069316 A1 | 3/2007 | Lee | |
| 2010/0309241 A1* | 12/2010 | Kwon | B41J 29/393 347/14 |
| 2011/0151173 A1 | 6/2011 | Ramadas et al. | |
| 2013/0101925 A1* | 4/2013 | Shimizu | G03F 7/70433 430/5 |
| 2015/0273913 A1* | 10/2015 | Warner | B41J 2/17509 347/19 |
| 2017/0032507 A1* | 2/2017 | Otaki | G06T 7/001 |
| 2018/0114306 A1* | 4/2018 | Ogawa | G02B 21/0092 |
| 2018/0129043 A1 | 5/2018 | Kim et al. | |

FOREIGN PATENT DOCUMENTS

| | | |
|---|---|---|
| KR | 10-0729114 B1 | 6/2007 |
| KR | 10-0784871 B1 | 12/2007 |
| KR | 10-2008-0041913 A | 5/2008 |
| KR | 10-2008-0062881 A | 7/2008 |
| KR | 10-0846839 B1 | 7/2008 |
| KR | 10-2009-0091957 A | 8/2009 |
| KR | 10-1244642 B1 | 3/2013 |
| KR | 10-1385262 B1 | 4/2014 |
| KR | 10-1620824 B1 | 5/2016 |
| KR | 10-1632622 B1 | 6/2016 |
| KR | 10-1719411 B1 | 3/2017 |
| KR | 10-1728943 B1 | 4/2017 |

* cited by examiner

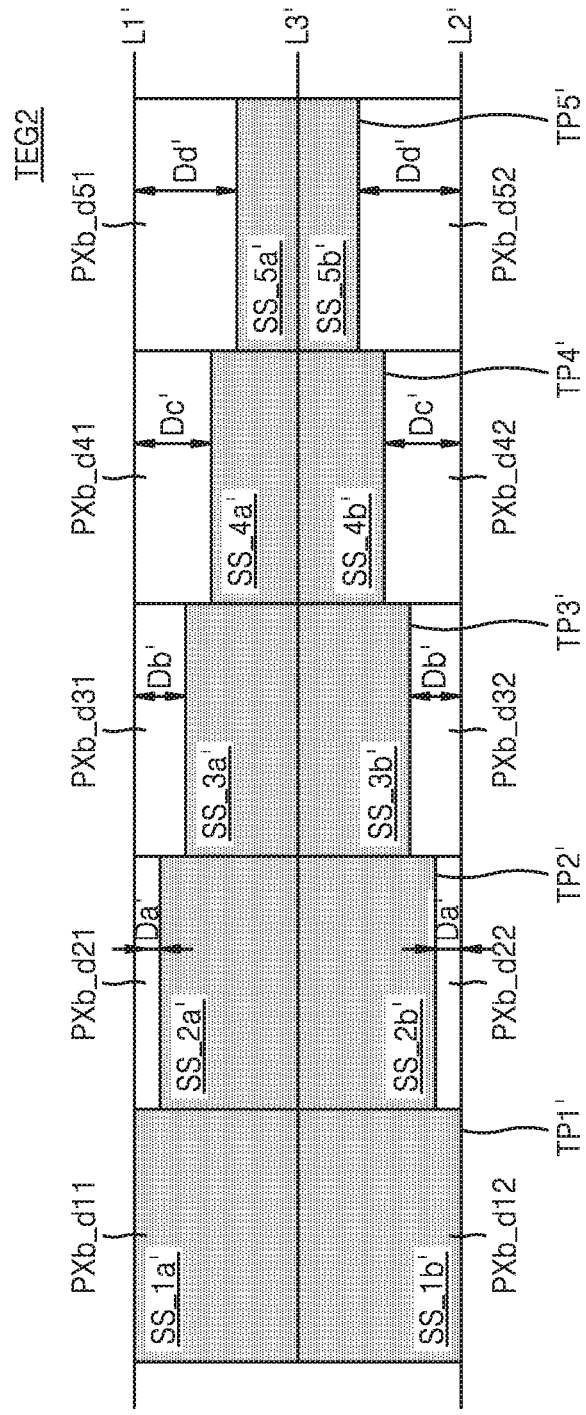

| DUMMY PIXEL SIGNAL VALUE | DEGREE OF MISALIGNMENT |
|---|---|
| 01111 | 0~Da |
| 00111 | Da~Db |
| 00011 | Db~Dc |
| 00001 | Dc~Dd |
| 00000 | Dd~ |

IMAGE SENSOR WITH TEST LIGHT SHIELDING PATTERN, IMAGING DEVICE, AND METHOD OF MANUFACTURING IMAGE SENSOR CHIP PACKAGE

CROSS-REFERENCE TO RELATED APPLICATION

This application claims priority from Korean Patent Application No. 10-2018-0003350, filed on Jan. 10, 2018, in the Korean Intellectual Property Office, the disclosure of which is incorporated by reference herein in its entirety.

BACKGROUND

Apparatuses, devices, methods and articles of manufacture consistent with the present disclosure relate to an image sensor, and more particularly, to an image sensor, an imaging device, and a method of manufacturing an image sensor chip package.

Examples of an image sensor that is a device for converting an optical image into an electrical signal include a charge-coupled device (CCD) image sensor and a complementary metal-oxide-semiconductor (CMOS) image sensor. The CMOS image sensor uses a plurality of transistors, and a signal charge generated in a photodiode is converted into a voltage in each pixel and then is output. Since the CMOS image sensor converts light into an electrical signal, image distortion may occur even with a slight change in external light. In particular, when a light-shielding structure formed around the photodiode for converting light into an electrical signal is misaligned, an output value of the CMOS image sensor may be changed, thereby leading to various defects. Studies are being conducted to solve these problems of the CMOS image sensor.

SUMMARY

It is an aspect to provide an image sensor, an imaging device, and a method of manufacturing an image sensor chip package which may improve the mass-production yield of the image sensor and the performance of the image sensor.

According to an aspect of an example embodiment, there is provided an image sensor including a pixel array comprising an active area in which a plurality of active pixels are located, and a dummy area in which a plurality of dummy pixels are located; and at least one test element group (TEG) which is located in the dummy area and on which a test light-shielding pattern, different from a light-shielding pattern formed on the active area, is formed to detect a degree of misalignment between the light-shielding pattern and the active area.

According to another aspect of an example embodiment, there is provided an imaging device including an image sensor comprising a pixel array comprising at least one test element group (TEG) on which a test light-shielding pattern, different from a light-shielding pattern formed on a plurality of active pixels, is formed to detect a degree of misalignment between the plurality of active pixels and the light-shielding pattern; and an image signal processor configured to receive a plurality of accumulated charges from a plurality of photodiodes of the plurality of active pixels, and perform image processing on the plurality of accumulated charges.

According to another aspect of an example embodiment, there is provided a method of manufacturing an image sensor chip package, the method including providing a wafer on which a plurality of semiconductor chips, each comprising at least one test element group (TEG) including a plurality of dummy pixels are formed; forming a light-shielding pattern on a plurality of active pixels of each of the plurality of semiconductor chips, and forming a test light-shielding pattern on the at least one TEG of each of the plurality of semiconductor chips; testing whether the light-shielding pattern of each of the semiconductor chips is aligned based on a plurality of pixel signals generated from the at least one TEG of each of the plurality of semiconductor chips; for any of the plurality of semiconductor chips on which the light-shielding pattern is not aligned, re-forming the light-shielding pattern of the semiconductor chip according to a test result; providing an individual image sensor chip by separating the plurality of semiconductor chips from the wafer; and packaging the individual image sensor chip.

BRIEF DESCRIPTION OF THE DRAWINGS

Example embodiments will be more clearly understood from the following detailed description taken in conjunction with the accompanying drawings in which:

FIGS. 8A through 8C are views illustrating test light-shielding patterns formed on a first test element group (TEG) and a second TEG in a step of manufacturing an image sensor, according to example embodiments;

DETAILED DESCRIPTION

Various example embodiments will now be described more fully with reference to the accompanying drawings, in which example embodiments are shown. It should be noted that, in this specification, the phrase "at least one of A and B" includes "only A," "only B," and "both A and B."

Figure 1:
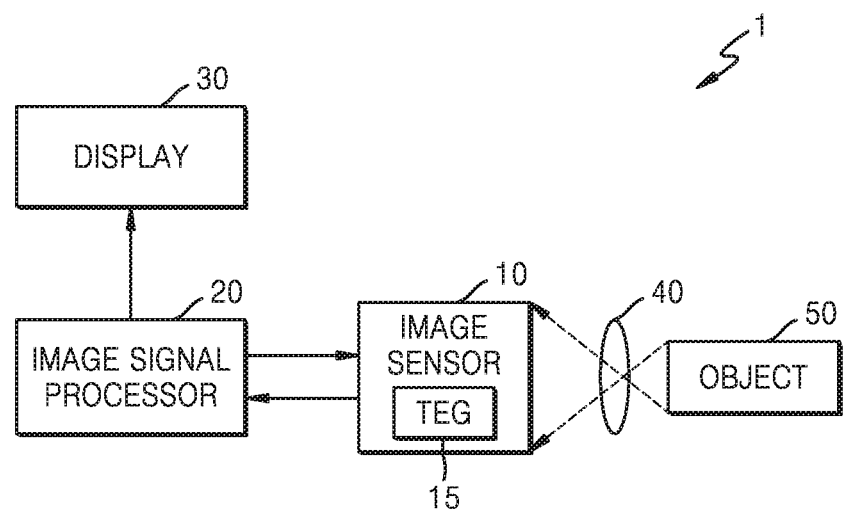
FIG. 1 is a block diagram of an imaging device according to an example embodiment.

FIG. 1 is a block diagram of an imaging device 1 according to an example embodiment.

Referring to FIG. 1, the imaging device 1 may include an image sensor 10, an image signal processor 20, and a display 30. The imaging device 1 may be a digital camera, or a portable electronic device to which a digital camera is attached, for example, a mobile phone, a smartphone, or a tablet personal computer (PC).

The image sensor 10 that is a semiconductor device for converting an optical image into an electrical signal may be, for example, a complementary metal-oxide-semiconductor (CMOS) image sensor. The image sensor 10 generates image data of an object 50 according to light incident through a lens 40, and outputs the generated image data to the image signal processor 20. The image signal processor 20 processes an image signal output from the image sensor 10, and transmits the processed image signal to the display 30.

Each of the image sensor 10 and the image signal processor 20 may be a printed circuit board (PCB) such as a motherboard, an integrated circuit (IC), or a system on chip (SoC). In an example embodiment, the image sensor 10 and the image signal processor 20 may be implemented by using a single package, for example, a multi-chip package (MCP) or a system in package (SiP). In an example embodiment, the image sensor 10 may be implemented as a separate chip, for example, a CMOS image sensor chip.

The image sensor 10 according to an example embodiment may include a test element group (TEG) 15. A light-shielding pattern may be formed on an active area of the image sensor 10 where active pixels of the image sensor 10 that generate an image signal are located. The TEG 15 may be used to detect a degree of misalignment between the light-shielding pattern and the active area (or the active pixels). The light-shielding pattern may prevent an area other than a photodiode area of each of the active pixels from being exposed to light. The light-shielding pattern may include a light-shielding structure (or a light-shielding member or a light-shielding film) formed on each of the active pixels. The light-shielding pattern may be formed of a material (e.g., tungsten or polysilicon) that blocks light. The TEG 15 may be used in a step of manufacturing the image sensor 10 and/or a step of using the image sensor 10.

First, in the step of manufacturing the image sensor 10, whether the light-shielding pattern is aligned with the active area and a degree of misalignment between the light-shielding pattern and the active area may be detected by using the TEG 15, and the light-shielding pattern may be re-formed on the active area based on the detected degree of misalignment. The TEG 15 may include a plurality of dummy pixels, and in the step of manufacturing the image sensor 10, a test light-shielding pattern, different from the light-shielding pattern formed on the active pixels, may be formed on the dummy pixels of the TEG 15. In an example embodiment, the test light-shielding pattern may include test light-shielding structures whose areas are the same as or different from each other according to the dummy pixels in order to detect the degree of misalignment between the light-shielding pattern and the active area, as described below in detail.

Since misalignment may occur between the light-shielding pattern and the active area due to factors after the step of manufacturing the image sensor 10, in the step of using the manufactured image sensor 10, whether the light-shielding pattern and the active area are aligned with each other, and a degree of misalignment (or states of the active pixels) between the light-shielding pattern and the active area may be detected by using the TEG 15. The image signal processor 20 may process an image signal output from the image sensor 10 based on the detected degree of misalignment (or the states of the active pixels). For example, the image signal processor 20 may apply different processing methods to the image signal considering the detected degree of misalignment.

The display 30 displays image data received from the image signal processor 20. The display 30 may be a thin-film transistor-liquid crystal display (TFT-LCD), a light-emitting diode (LED) display, an organic LED (OLED) display, or an active-matrix OLED (AMOLED) display.

The image sensor 10 according to an example embodiment may rapidly and accurately detect whether the active area where the active pixels are located and the light-shielding pattern are aligned with each other and, in the case of misalignment, a degree of misalignment between the active area and the light-shielding pattern by using the TEG 15 on which the test light-shielding pattern is formed. Also, the detected degree of misalignment may be reflected in the step of manufacturing the image sensor 10 and/or the step of using the image sensor 10, thereby improving the mass-production yield of the image sensor 10 and/or the performance of the image sensor 10.

Figure 2:
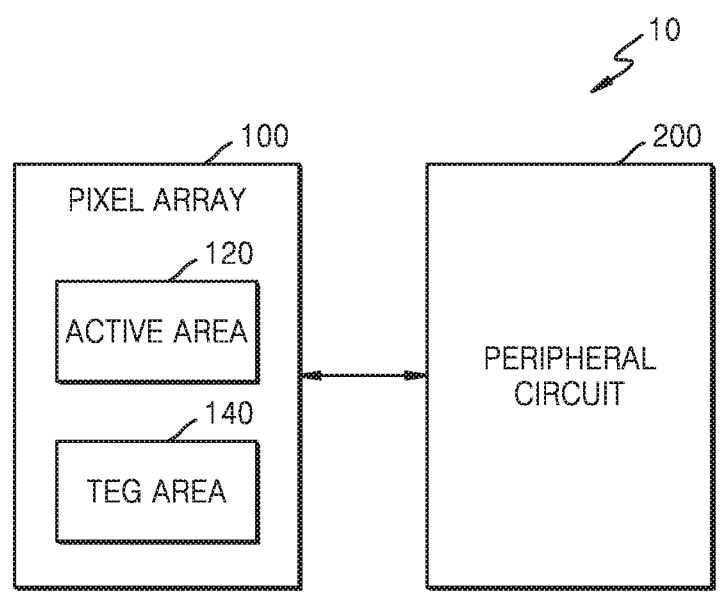
FIG. 2 is a block diagram of an image sensor of FIG. 1.

FIG. 2 is a block diagram of the image sensor 10 of FIG. 1.

Referring to FIG. 2, the image sensor 10 may include a pixel array 100 and a peripheral circuit 200. The pixel array 100 may include an active area 120 and a TEG area 140. A plurality of active pixels may be located in the active area 120, and a plurality of dummy pixels may be located in the TEG area 140. Although only one TEG area 140 is exemplarily shown in FIG. 2, the inventive concept is not limited thereto and the pixel array 100 may further include one or more TEG areas. A light-shielding pattern may be formed on the active area 120, and a test light-shielding pattern may be formed on the TEG area 140.

The peripheral circuit 200 may include at least one logic block. The logic block is a logic circuit including a plurality of logic elements configured to receive a power signal or a control signal and perform a logic operation according to the received power signal or control signal. The logic block that is a pre-defined functional block may be referred to as a digital block or an intellectual property (IP) block.

Figure 3:
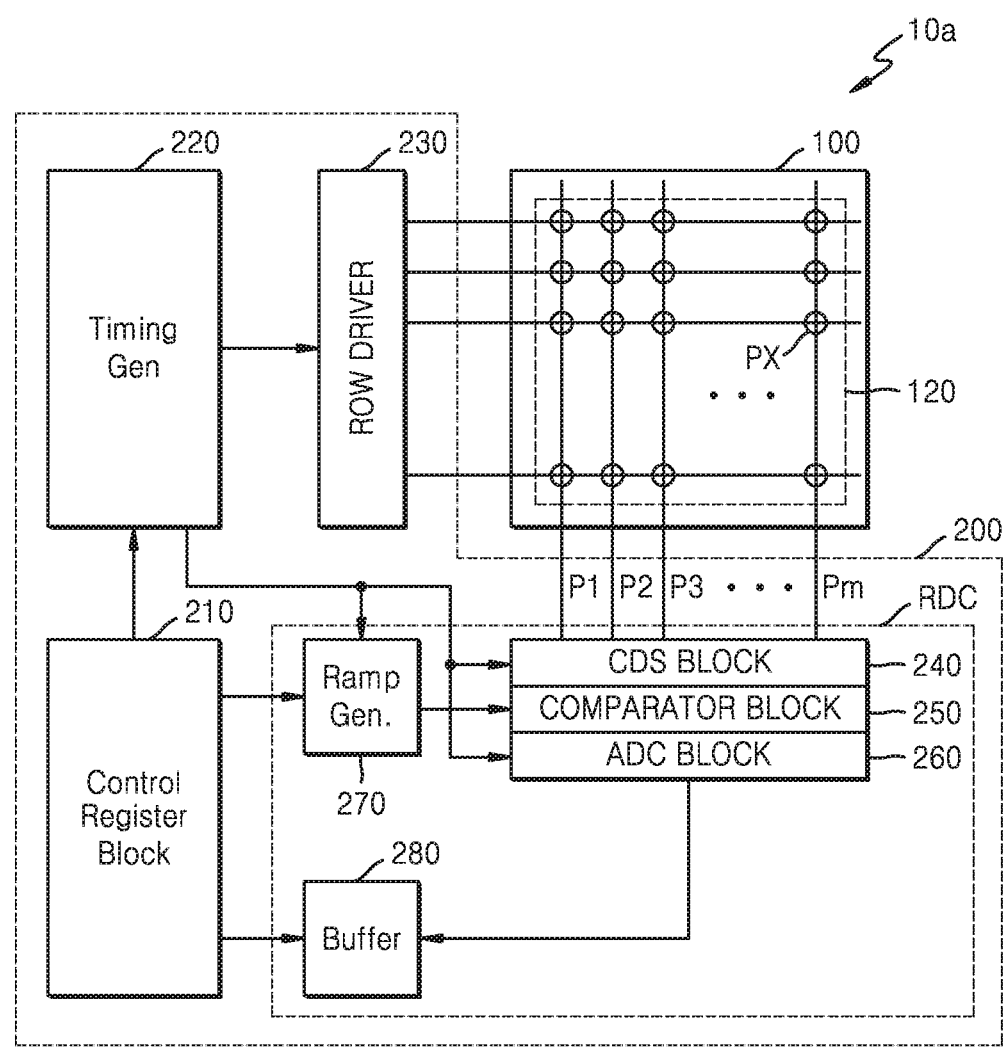
FIG. 3 is a detailed block diagram of an image sensor according to an example embodiment.

FIG. 3 is a detailed block diagram of an image sensor 10a according to an example embodiment.

Referring to FIG. 3, the image sensor 10a may include the pixel array 100 and the peripheral circuit 200. The pixel array 100 and the peripheral circuit 200 may respectively correspond to the pixel array 100 and the peripheral circuit 200 of FIG. 2. The peripheral circuit 200 may include a control register block 210, a timing generator 220, a row driver 230, a correlated double sampling (CDS) block 240, a comparator block 250, an analog-to-digital conversion (ADC) block 260, a ramp signal generator 270, and a buffer 280. In this case, the CDS block 240, the comparator block 250, the ADC block 260, the ramp signal generator 270, and the buffer 280 may constitute a read out circuit RDC.

The pixel array 100 may include a plurality of pixels PX arranged in a matrix. The pixel array 100 may include the active area 120, and the plurality of pixels PX of FIG. 3 may be referred to as active pixels located in the active area 120. Each of the pixels PX may be connected between a row line and a column line, and may output a pixel signal according to incident light. In an example embodiment, each pixel PX may have a multi-layer structure including an organic photoelectric conversion unit or an inorganic photoelectric conversion unit. In an example embodiment, each pixel PX may have a multi-layer structure in which only organic photoelectric conversion units are stacked.

The timing generator 220 may generate control signals for controlling the operation timing of the image sensor 10a. In detail, the timing generator 220 may control operations of the row driver 230, the CDS block 240, the ADC block 260, and the ramp signal generator 270 under the control of the control register block 210.

The row driver 230 may drive at least one from among a plurality of row lines of the pixel array 100 under the control of the timing generator 220. In detail, the row driver 230 may apply a row signal to each of the plurality of row lines of the pixel array 100. The row signal may include a plurality of control signals for controlling a plurality of transistors included in a unit pixel.

The CDS block 240 receives pixel signals P1 through Pm (where m is a natural number) from a plurality of column lines included in the pixel array 100, and performs CDS on each of the pixel signals P1 through Pm. In detail, the CDS block 240 may perform double sampling on a noise level and a signal level corresponding to a pixel signal, and may output a difference level corresponding to a difference between the noise level and the signal level.

The comparator block 250 compares each of CDS pixel signals output from the CDS block 240 with a ramp signal output from the ramp signal generator 270 and outputs comparison signals. In the present example embodiment, the peripheral circuit 200 may further include at least one redundancy comparator block that may replace the comparator block 250.

The ADC block 260 counts the comparison signals according to a clock signal, converts the plurality of comparison signals output from the comparator block 250 into a plurality of pieces of digital data, and outputs the plurality of pieces of digital data to the buffer 280.

The ramp signal generator (Ramp Gen.) 270 generates a ramp signal under the control of the timing generator 220. The ramp signal generator 270 may cause a voltage level of the ramp signal to change as current changes with time, by using a current-based digital-to-analog converter (DAC) or voltage-current (V-I) converter. The ramp signal may be generated as a voltage having a single slope, may be applied to the comparator block 250, and may be compared with a pixel signal output from the pixel array 100.

The control register block 210 may control operations of the timing generator 220, the ramp signal generator 270, and the buffer 280 under the control of the image signal processor 20 (see FIG. 1).

The buffer 280 may store digital data output from the ADC block 260 in units of frames, and thus may be referred to as a frame memory or a buffer memory. The buffer 280 may output the digital data stored in units of frames to the image signal processor 20 (see FIG. 1).

Figure 4A:
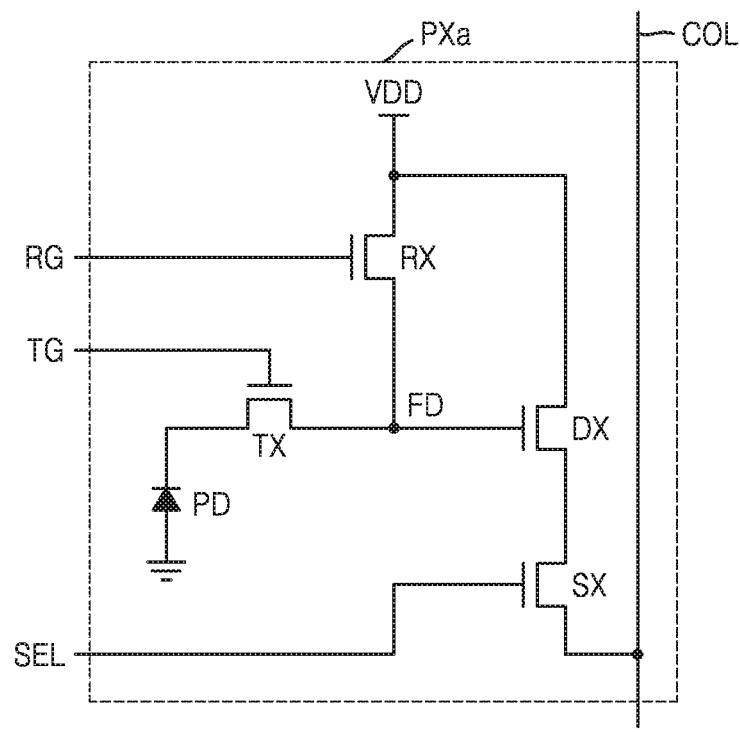
FIGS. 4A through 4C are circuit diagrams illustrating a unit pixel according to some example embodiments.
Figure 4B:
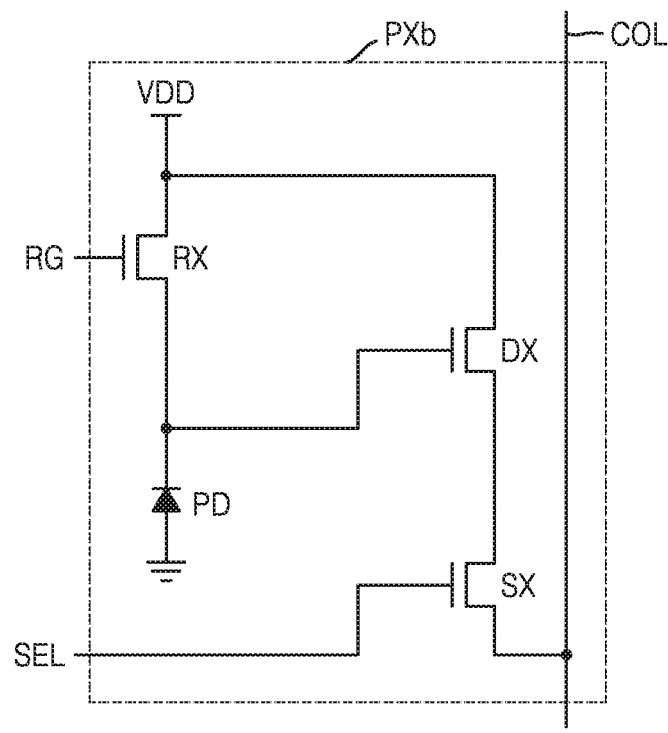
Figure 4C:
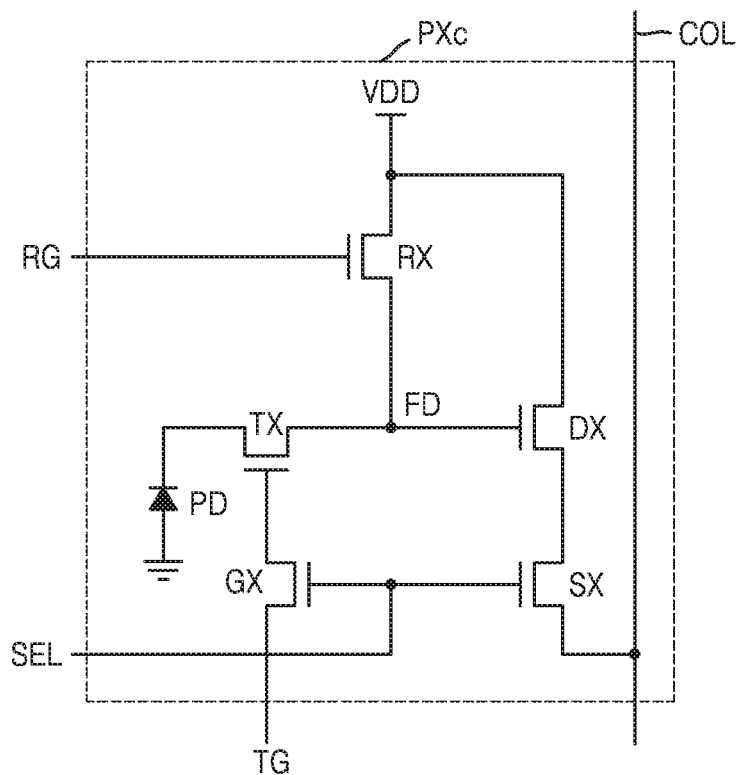

FIGS. 4A through 4C are circuit diagrams of a unit pixel according to some example embodiments.

Referring to FIG. 4A, a unit pixel PXa includes a photodiode PD, a transfer transistor TX, a reset transistor RX, a drive transistor DX, and a select transistor SX. The unit pixel PXa according to the present example embodiment may correspond to the pixel PX of FIG. 3.

The unit pixel PXa may receive a row signal from the outside, for example, the row driver 230 (see FIG. 3). The row signal may include a reset signal RG applied to a gate of the reset transistor RX, a transfer signal TG applied to a gate of the transfer transistor TX, and a select signal SEL applied to a gate of the select transistor SX. Also, the unit pixel PXa may generate a pixel signal according to a detected intensity of light, and may output the generated pixel signal to the outside, for example, the CDS block 240 (see FIG. 3).

The photodiode PD may receive light and generate photo charges, and may be referred to as a light detecting element. The photodiode PD may include at least one from among a phototransistor, a photogate, a pinned photodiode (PPD), and a combination thereof. The transfer transistor TX transfers the photo charges generated by the photodiode PD to a floating diffusion region FD. Also, the rest transistor RX periodically resets the photo charges stored in the floating diffusion region FD, the drive transistor DX functions as a source follower buffer amplifier and buffers a signal according to the photo charges filled in the floating diffusion region FD, and the select transistor SX functions as a switching and addressing element for selecting the unit pixel PXa.

Although a 4-transistor (4T) unit pixel including one photodiode PD and four MOS transistors (i.e., TX, RX, DX, and SX) is illustrated in FIG. 4A, the inventive concept is not limited thereto and may be applied to any circuit including the photodiode PD and at least three transistors including the drive transistor DX and the select transistor SX. Other unit pixels are illustrated in FIGS. 4B and 4C.

Referring to FIG. 4B, a unit pixel PXb that is a 3-transistor (3T) unit pixel may include the photodiode PD, the reset transistor RX, the drive transistor DX, and the select transistor SX. Referring to FIG. 4C, a unit pixel PXc that is a 5-transistor (5T) unit pixel may include the photodiode PD, the reset transistor RX, the drive transistor DX, and the select transistor SX, and may further include one transistor GX.

Figure 5:
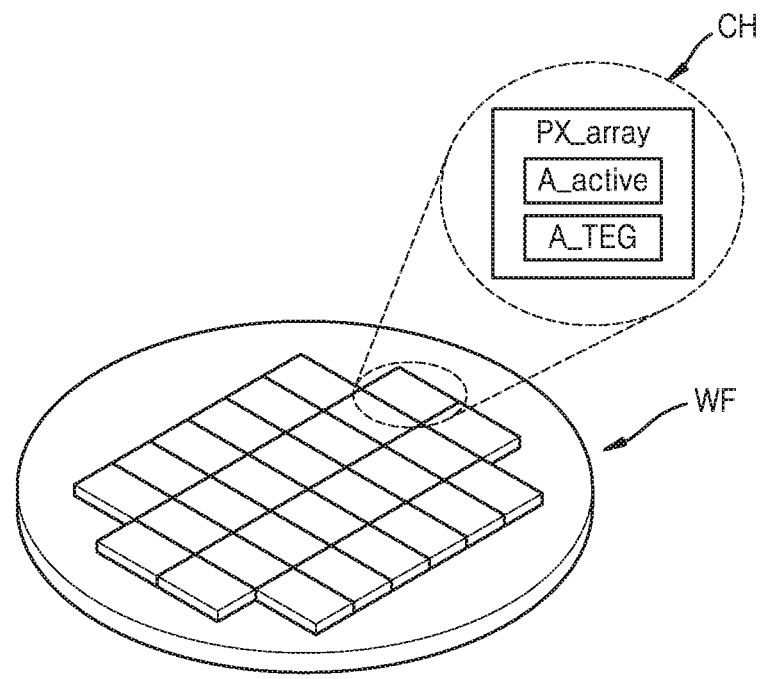
FIG. 5 is a view of a wafer on which image sensor chips are arranged according to an example embodiment.

FIG. 5 is a view of a wafer WF on which image sensor chips CH are arranged according to an example embodiment.

Referring to FIG. 5, the plurality of image sensor chips CH may be arranged on one surface of the wafer WF in a two-dimensional (2D) manner. The image sensor chips CH may be referred to as semiconductor chips. Each of the image sensor chips CH may include a pixel array PX_array, and the pixel array PX_array may include an active area A_active where a plurality of active pixels are located and a TEG area A_TEG where a plurality of dummy pixels are located.

In a step of manufacturing the image sensor chip CH, a light-shielding pattern may be formed on the active area A_active, and a test light-shielding pattern may be formed on the TEG area A_TEG. Next, whether the active area A_active and the light-shielding pattern are aligned with each other and, in the case of misalignment, a degree of misalignment between the active area A_active and the light-shielding pattern may be detected based on pixel signals generated from the dummy pixels located in the TEG area A_TEG.

Although not shown in FIG. 5, the image sensor chip CH may further include the peripheral circuit 200 (see FIG. 2).

Figure 6A:
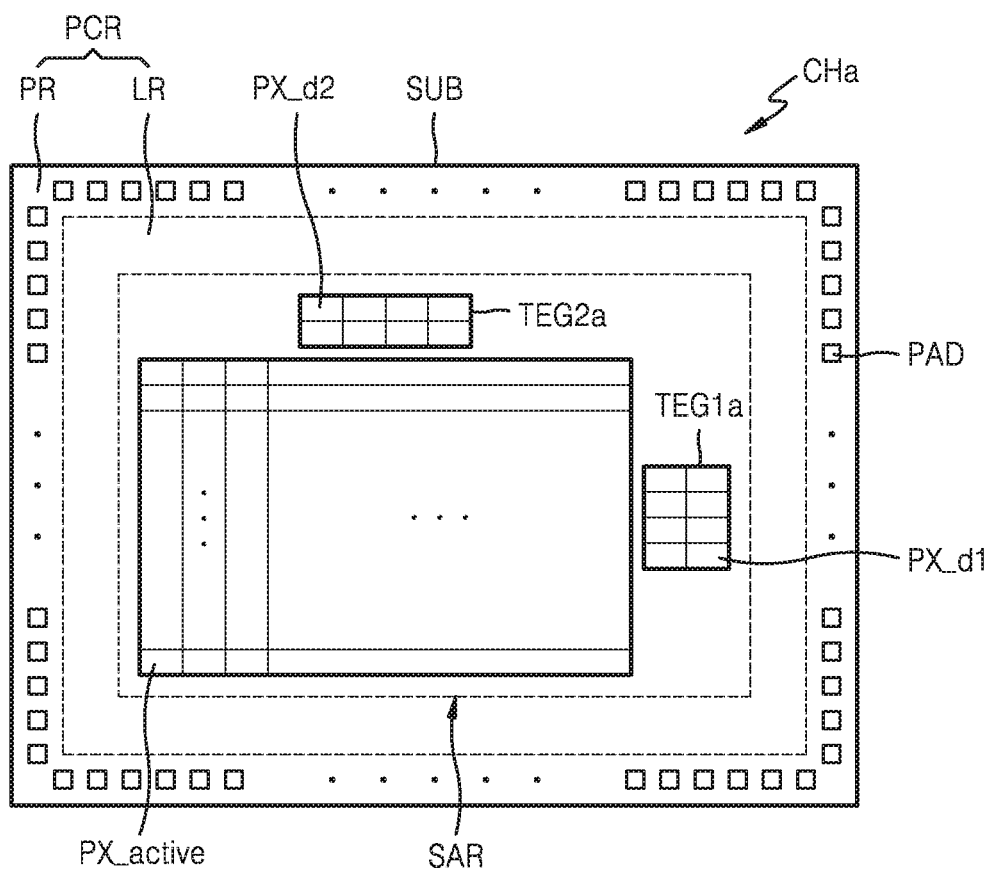
FIGS. 6A and 6B are plan views of image sensor chips according to an example embodiment.
Figure 6B:
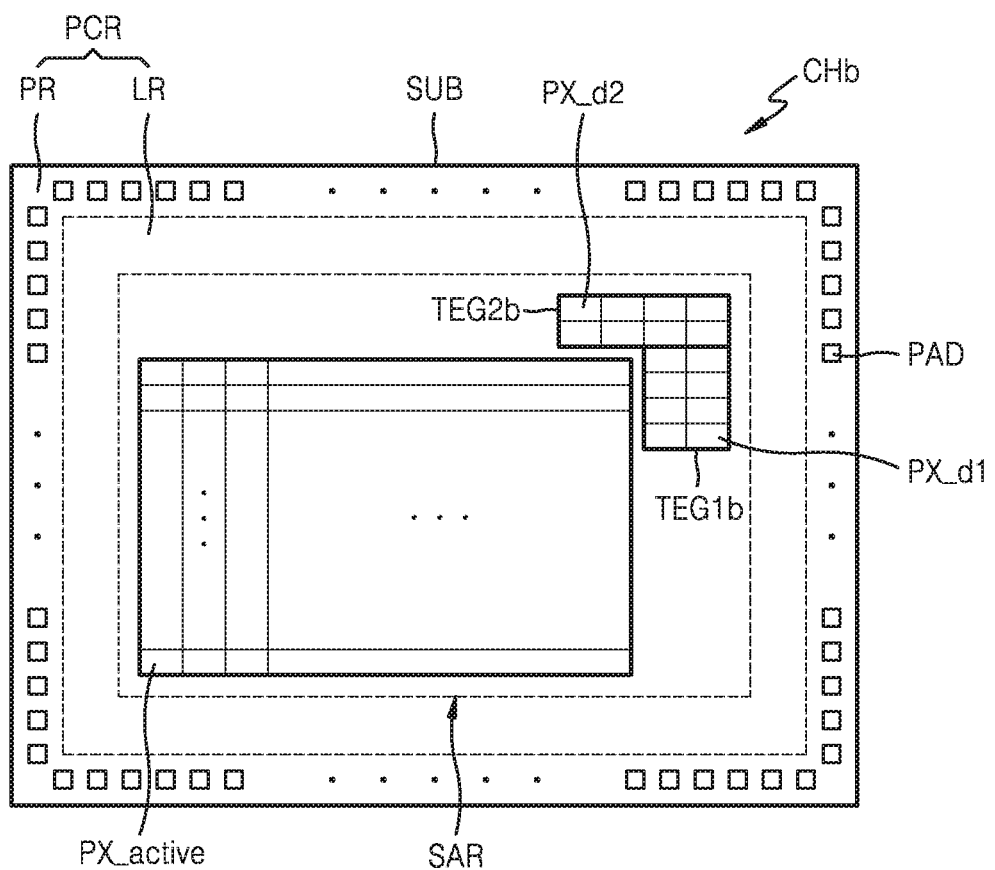

FIGS. 6A and 6B are plan views illustrating image sensor chips CHa and CHb, respectively, according to example embodiments.

Referring to FIG. 6A, the image sensor chip CHa may include a sensor array region SAR, a logic region LR, and a pad region PR formed on a semiconductor substrate SUB. Except for the sensor array region SAR, the logic region LR and the pad region PR may be correctively referred to as a peripheral circuit region PCR, and the peripheral circuit region PCR refers to a region other than the sensor array region SAR on the substrate SUB of the image sensor chip CHa. The image sensor chip CHa according to an example embodiment may be an example of the image sensor chip CH of FIG. 5. However, the image sensor chip CHa is not limited to a configuration of FIG. 6A, and in some example embodiments may omit the logic region LR.

The semiconductor substrate SUB may include, for example, silicon (Si). Alternatively, the semiconductor substrate SUB may include a semiconductor element such as germanium (Ge), or a compound semiconductor such as silicon carbide (SiC), gallium arsenide (GaAs), indium arsenide (InAs), or indium phosphide (InP). Alternatively, the semiconductor substrate SUB may include a silicon on insulator (SOI) structure or a buried oxide (BOX) layer. The semiconductor substrate SUB may include a conductive region, for example, a well doped with impurities or a structure doped with impurities. Also, the semiconductor substrate SUB may have any of various device isolation structures such as a shallow trench isolation (STI) structure.

The sensor array region SAR where a pixel array is formed may include a plurality of active pixels PX_active and a first TEG (TEG1a) and a second TEG (TEG2a). However, the sensor array region SAR of FIG. 6A is just an example, and the inventive concept is not limited thereto. In some example embodiments, the sensor array region SAR may include any one from among the first and second TEGs TEG1a and TEG2a, or may further include one or more additional TEGs in addition to the first and second TEGs TEG1a and TEG2a. That is, the number of TEGs is not particularly limited. Consistent with the above description, the first TEG TEG1a may include a plurality of dummy pixels PX_d1, and the second TEG TEG2a may include a plurality of dummy pixels PX_d2.

In an example embodiment, the first TEG TEG1a may be located adjacent to at least one of a left side and a right side of an active area where the active pixels PX_active are located. For example, as shown in FIG. 6A, the first TEG TEG1a may be located at the right side of the active area. A test light-shielding pattern for detecting an existence of left/right alignment between the active area and a light-shielding pattern and, in the case of misalignment, a degree of left/right misalignment between the active area and the light-shielding pattern may be formed on the first TEG TEG1a. The test light-shielding pattern formed on the first TEG TEG1a will be described below in detail with reference to FIG. 8A.

In an example embodiment, the second TEG TEG2a may be located adjacent to at least one of an upper side and a lower side of the active area. For example, as shown in FIG. 6A, the second TEG TEG2a may be located at the upper side of the active area. A test light-shielding pattern for detecting an existence of upper/lower alignment between the active area and the light-shielding pattern and, in the case of misalignment, a degree of upper/lower misalignment between the active area and the light-shielding pattern may be formed on the second TEG TEG2a. The test light-shielding pattern formed on the second TEG TEG2a will be described below in detail with reference to FIG. 8B.

The first TEG TEG1a and the second TEG TEG2a may be spaced apart by a predetermined distance from each other. The number of dummy pixels included in the first TEG TEG1a and the number of dummy pixels included in the second TEG TEG2a may be the same as, or different from, each other. Also, an arrangement of the first TEG TEG1a and the second TEG TEG2a of FIG. 6A is just exemplary, and the inventive concept is not limited thereto. In some example embodiments, the first TEG TEG1a and the second TEG TEG2a may be located at various positions.

The logic region LR may be located along edges of the sensor array region SAR. Although the logic region LR is located along all four edges of the sensor array region SAR in the illustration of FIG. 6A, the inventive concept is not limited thereto. In some example embodiments, the logic region LR may be located along only two edges or only three edges of the sensor array region SAR.

The logic region LR may include electronic elements including a plurality of transistors, and may control an output signal or may apply a predetermined signal to the active pixels PX_active or the dummy pixels PX_d1 and PX_d2 of the sensor array region SAR. The pad region PR includes a plurality of pads used to transmit/receive an electrical signal to/from an external device or a package base substrate. The pad region PR is located around the sensor array region SAR. In detail, the plurality of pads PAD formed on the pad region PR are electrically connected to the active pixels PX_active or the dummy pixels PX_d1 and PX_d2, and are located around the sensor array region SAR. Although the image sensor chip CHa according to an example embodiment includes the pad region PR, the inventive concept is not limited thereto, and in another example embodiment, the image sensor chip CHa may not include the pad region PR and pads or connectors may be located under the sensor array region SAR or the logic region LR.

Each of the plurality of pads PAD may be formed of, for example, metal, metal nitride, or a combination thereof. A conductive wiring and a conductive plug for electrically connecting the plurality of active pixels PX_active or the dummy pixels PX_d1 and PX_d2 included in the sensor array region SAR, the electronic elements included in the logic region LR, and the plurality of pads PAD are formed on the substrate SUB. Each of the conductive wiring and the conductive plug may be formed of, for example, metal, metal nitride, or a combination thereof.

Referring to FIG. 6B, unlike in FIG. 6A, the first and second TEG may contact each other. As shown in FIG. 6B, a first TEG TEG1b and a second TEG TEG2b may contact each other. In an example embodiment, the first TEG TEG1b and the second TEG TEG2b may contact each other in a diagonal direction of the active area. That is, at least one dummy pixel included in the first TEG TEG1b and at least one dummy pixel included in the second TEG TEG2b may contact each other.

Figure 7A:
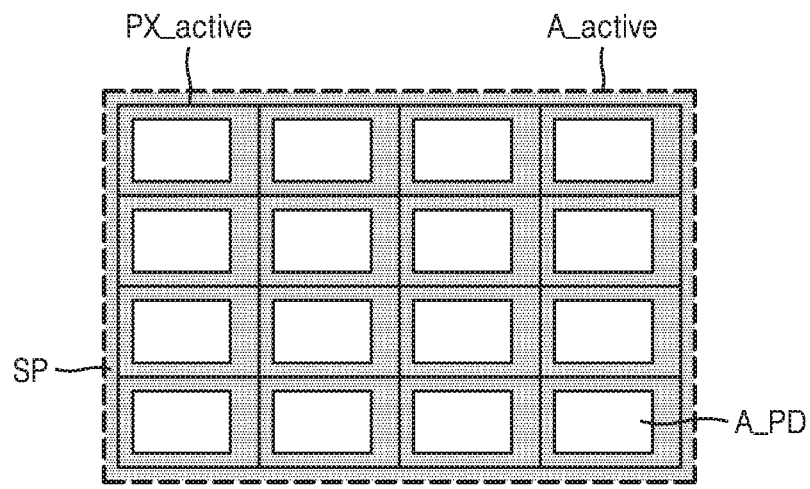
FIG. 7A is a plan view illustrating a state wherein a light-shielding pattern is aligned with an active area.
Figure 7B:
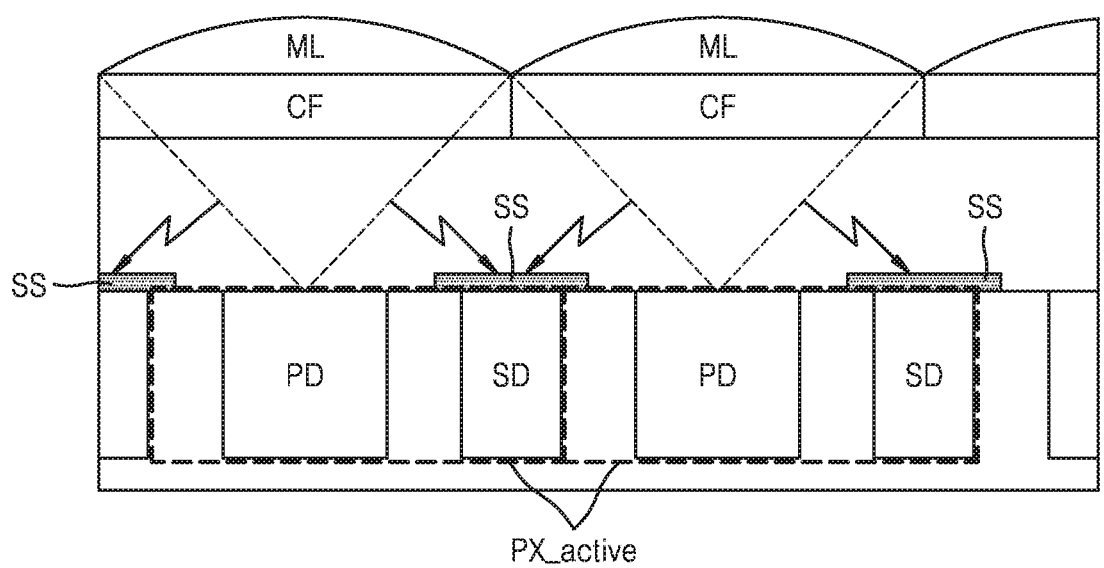
FIG. 7B is a cross-sectional view of the image sensor in the state of FIG. 7A.
Figure 7C:
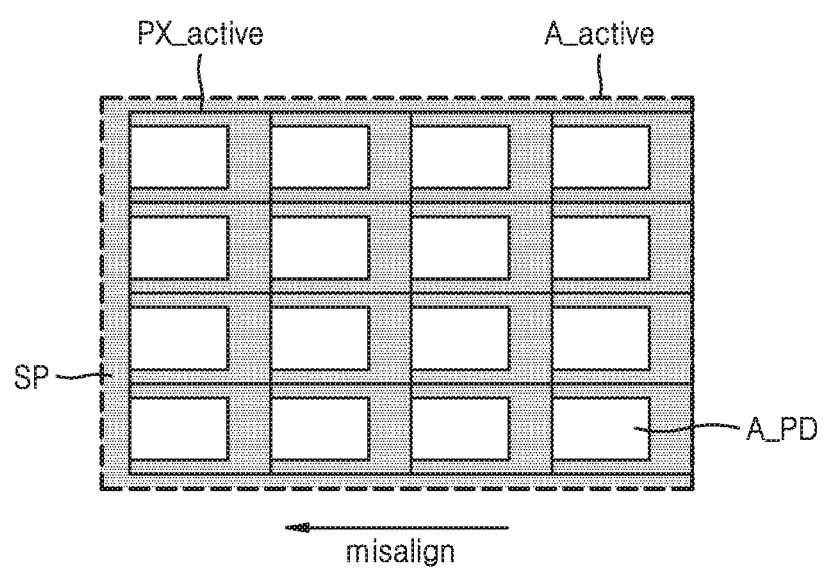
FIG. 7C is a plan view illustrating a state where the light-shielding pattern is misaligned with the active area.

FIG. 7A is a plan view illustrating a state where a light-shielding pattern is aligned with the active area A_active. FIG. 7B is a cross-sectional view of the image sensor 10 in the state of FIG. 7A. FIG. 7C is a plan view illustrating a state where the light-shielding pattern is misaligned with the active area A_active.

Referring to FIG. 7A, in a step of manufacturing the image sensor 10, a light-shielding pattern SP may be formed on the active area A_active of the image sensor 10. The light-shielding pattern SP may be formed to prevent areas other than a photodiode area A_PD where a photodiode of each of the active pixels PX_active is formed from being exposed to light. The light-shielding pattern SP may include a light-shielding structure formed on each active pixel PX_active.

Referring to FIG. 7B, the image sensor 10 may include a microlens ML, a color filter CF, a light-shielding structure SS, and the active pixel PX_active. The active pixel PX_active may include a photodiode PD and a storage diode SD. The photodiode PD converts incident light into charges and accumulates the charges, and the accumulated charges are stored in the storage diode SD. In this case, the light-shielding structure SS may be formed on the active pixel PX_active so that light is incident on the photodiode PD and is blocked by the storage diode SD.

Referring to FIG. 7C, due to factors in or after a step of manufacturing the image sensor 10, the light-shielding pattern SP may be eccentrically formed in a predetermined direction (e.g., leftward) and may be misaligned with the active area A_active. Accordingly, the light-shielding pattern SP may be formed on a portion of the photodiode area A_PD such that a part of light incident on a photodiode may be blocked and a storage diode of the active pixel PX_active may be exposed to light, and thus an output value of the active pixel PX_active may not be a desired value. In the step of manufacturing the image sensor 10, in order to align the light-shielding pattern SP with the active area A_active as shown in FIG. 7A, a TEG may be used. A test light-shielding pattern formed on the TEG will be described below in detail.

Figure 8A:
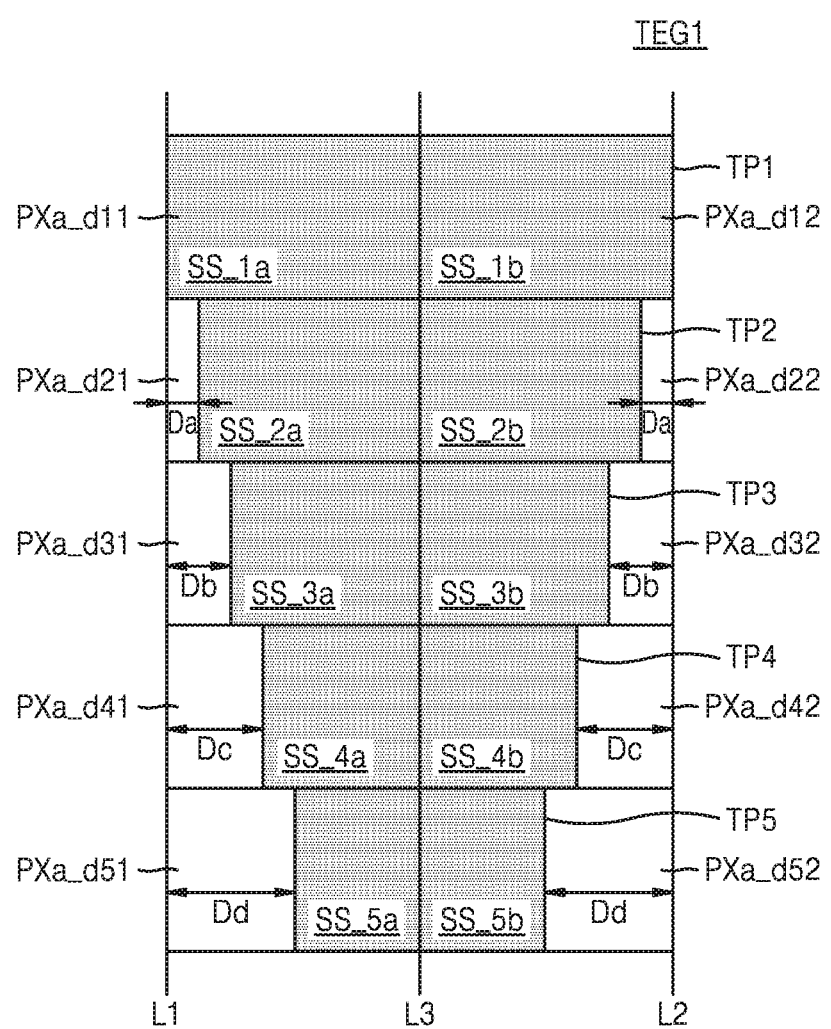
Figure 8C:
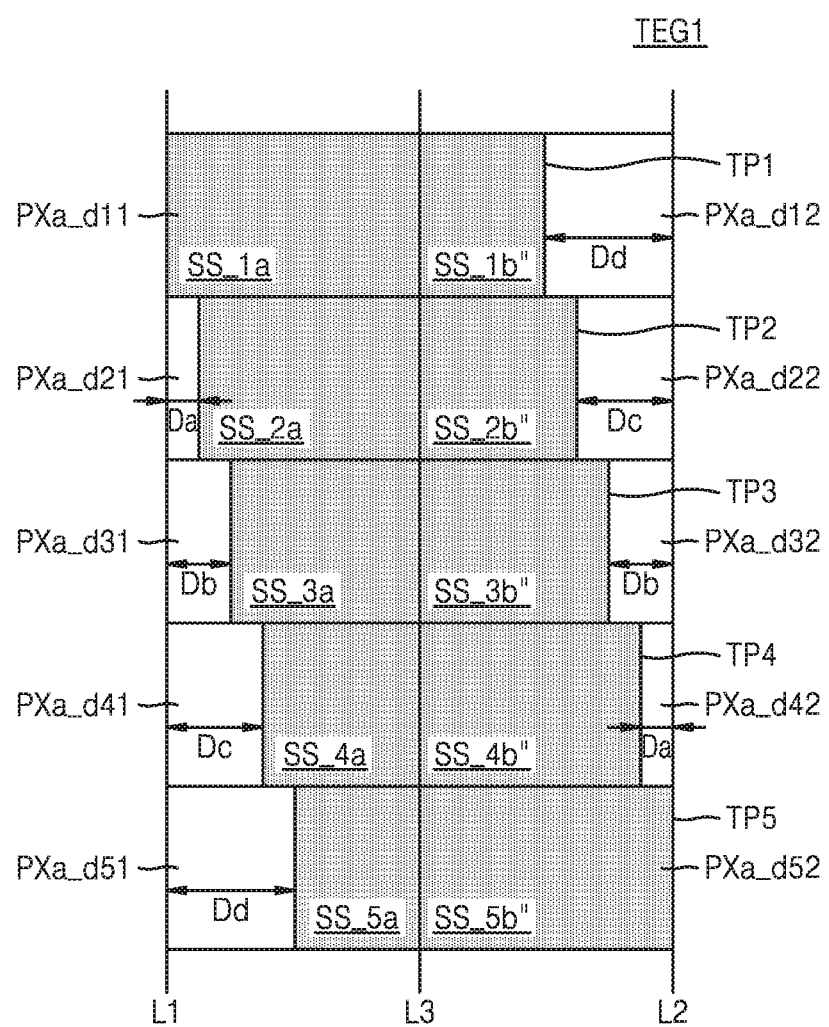

FIGS. 8A through 8C are views illustrating test light-shielding patterns formed on a first TEG TEG1 and a second TEG TEG2 in a step of manufacturing an image sensor. The test light-shielding patterns of FIGS. 8A through 8C are configured to accurately determine a degree of misalignment between an active area of the image sensor and a light-shielding pattern. Although the test light-shielding patterns of FIGS. 8A through 8C is formed on the first TEG TEG1 and the second TEG TEG2 in the step of manufacturing the image sensor, the test light-shielding patterns may be misaligned due to various factors such as an environment of a manufacturing process as shown in FIG. 9B. A misalignment tendency between the active area and the light-shielding pattern may be the same as or similar to a misalignment tendency between the TEG and the test light-shielding pattern.

The first TEG TEG1 of FIG. 8A may correspond to the first TEG TEG1a or the first TEG TEG1b of FIG. 6A or 6B, respectively. The first TEG TEG1 may include a plurality of dummy pixels PXa_d11, PXa_d21, PXa_d31, PXa_d41, PXa_d51, PXa_d12, PXa_d22, PXa_d32, PXa_d42, and PXa_d52, and the plurality of dummy pixels PXa_d11 through PXa_d52 may be divided into first group dummy pixels and second group dummy pixels. However, the first TEG TEG1 of FIG. 8A is exemplary, and the inventive concept is not limited thereto and the first TEG TEG1 may include more or less dummy pixels than illustrated in FIG. 8A.

In an example embodiment, the first group dummy pixels for detecting a degree of left misalignment between an active area and a light-shielding pattern may include the dummy pixel PXa_d11, the dummy pixel PXa_d21, the dummy pixel PXa_d31, the dummy pixel PXa_d41, and the dummy pixel PXa_d51 that are vertically aligned. The second group dummy pixels for detecting a degree of right misalignment between the active area and the light-shielding pattern may include the dummy pixel PXa_d12, the dummy pixel PXa_d22, the dummy pixel PXa_d32, the dummy pixel PXa_d42, and the dummy pixel PXa_d52 that are vertically aligned.

In an example embodiment, a test light-shielding pattern may be formed on the first TEG TEG1 in a step of manufacturing an image sensor. The test light-shielding pattern may include a first test pattern TP1, a second test pattern TP2, a third test pattern TP3, a fourth test pattern TP4 and a fifth test pattern TP5. The first test pattern TP1 may include a test light-shielding structure SS_1a formed on the dummy pixel PXa_d11 and a test light-shielding structure SS_1b formed on the dummy pixel PXa_d12. The second test pattern TP2 may include a test light-shielding structure SS_2a formed on the dummy pixel PXa_d21 and a test light-shielding structure SS_2b formed on the dummy pixel PXa_d22. The third test pattern TP3 may include a test light-shielding structure SS_3a formed on the dummy pixel PXa_d31 and a test light-shielding structure SS_3b formed on the dummy pixel PXa_d32. The fourth test pattern TP4 may include a test light-shielding structure SS_4a formed on the dummy pixel PXa_d41 and a test light-shielding structure SS_4b formed on the dummy pixel PXa_d42. The fifth test pattern TP5 may include a test light-shielding structure SS_5a formed on the dummy pixel PXa_d51 and a test light-shielding structure SS_5b formed on the dummy pixel PXa_d52.

Upon examining the test light-shielding patterns formed on the first group dummy pixels PXa_d11 through PXa_d51, the test light-shielding structure SS_1a may be formed on the entire dummy pixel PXa_d11, and the test light-shielding structures SS_2a through SS_5a may be formed to be spaced apart by distances Da, Db, Dc, and Dd, respectively, from a start line L1 of the test light-shielding structure SS_1a. In an example embodiment, differences among the distances Da, Db, Dc, and Dd may be the same as, or different from, one another. In detail, differences between the distances Db and Da, between the distances Dc and Db, and between the distances Dd and Dc may be the same as, or different from, one another. That is, the test light-shielding patterns formed on the first group dummy pixels PXa_d11 through PXa_d51 may have a downward stepped shape in a down direction. In another example embodiment, the test light-shielding patterns formed on the first group dummy pixels PXa_d11 through PXa_d51 may include test light-shielding structures whose areas are different according to the first group dummy pixels PXa_d11 through PXa_d51.

Upon examining the test light-shielding patterns formed on the second group dummy pixels PXa_d12 through PXa_d52, the test light-shielding structure SS_1b may be formed on the entire dummy pixel PXa_d12, and the test light-shielding structures SS_2b through SS_5b may be formed to be spaced apart by the distances Da, Db, Dc, and Dd, respectively, from a start line L2 of the test light-shielding structure SS_1b b. In an example embodiment, differences among the distances Da, Db, Dc, and Dd may be the same as, or different from, one another. In detail, differences between the distances Db and Da, between the distances Dc and Db, and between the distances Dd and Dc may be the same as, or different from, one another. That is, the test light-shielding patterns formed on the second group dummy pixels PXa_d12 through PXa_d52 may have a downward stepped shape in the down direction. In another example embodiment, the test light-shielding patterns formed on the second group dummy pixels PXa_d12 through PXa_d52 may include test light-shielding structures whose areas are different according to the second group dummy pixels PXa_d12 through PXa_d52.

Also, the test light-shielding patterns formed on the first group dummy pixels PXa_d11 through PXa_d51 and the test light-shielding patterns formed on the second group dummy pixels PXa_d12 through PXa_d52 may be symmetric with each other about a line L3 that contacts the first group dummy pixels PXa_d11 through PXa_d51 and the second group dummy pixels PXa_d12 through PXa_d52.

However, the test light-shielding patterns of FIG. 8A are exemplary, and the inventive concept is not limited thereto. In some example embodiments, the test light-shielding patterns may have any of various shapes according to the number of dummy pixels included in the first TEG TEG1. For example, the test light-shielding patterns may have a shape obtained by vertically inverting the test light-shielding patterns of FIG. 8A, or the test light-shielding patterns formed on the first group dummy pixels PXa_d11 through PXa_d51 and the test light-shielding patterns formed on the second group dummy pixels PXa_d12 through PXa_d52 may be asymmetric.

Referring to FIG. 8B, the second TEG TEG2 may correspond to the second TEG TEG2a or the second TEG TEG2b of FIG. 6A or 6B, respectively. The second TEG TEG2 may include a plurality of dummy pixels PXb_d11, PXb_d21, PXb_d31, PXb_d41, PXb_d51, PXb_d12, PXb_d22, PXb_d32, PXb_d42, and PXb_d52, and the plurality of dummy pixels PXb_d11 through PXb_d52 may be divided into first group dummy pixels and second group dummy pixels. However, the second TEG TEG2 of FIG. 8B is exemplary, and the inventive concept is not limited thereto. In some example embodiments, the second TEG TEG2 may include more or less dummy pixels than illustrated in FIG. 8B.

In an example embodiment, the first group dummy pixels for detecting a degree of up misalignment between the active area and the light-shielding pattern may include the dummy pixel PXb_d11, the dummy pixel PXb_d21, the dummy pixel PXb_d31, the dummy pixel PXb_d41, and the dummy pixel PXb_d51 that are horizontally aligned. Also, the second group dummy pixels for detecting a degree of down misalignment between the active area and the light-shielding pattern may include the dummy pixel PXb_d12, the dummy pixel PXb_d22, the dummy pixel PXb_d32, the dummy pixel PXb_d42, and the dummy pixel PXb_d52.

In an example embodiment, a test light-shielding pattern may be formed on the second TEG TEG2 in a step of manufacturing an image sensor. The test light-shielding pattern may include first through fifth test patterns TP1' through TP5'. The first test pattern TP1' may include a test light-shielding structure SS_1a' formed on the dummy pixel PXb_d11 and a test light-shielding structure SS_1b' formed on the dummy pixel PXb_d12. The second test pattern TP2' may include a test light-shielding structure SS_2a' formed on the dummy pixel PXb_d21 and a test light-shielding structure SS_2b' formed on the dummy pixel PXb_d22. The third test pattern TP3' may include a test light-shielding structure SS_3a' formed on the dummy pixel PXb_d31 and a test light-shielding structure SS_3b' formed on the dummy pixel PXb_d32. The fourth test pattern TP4' may include a test light-shielding structure SS_4a' formed on the dummy pixel PXb_d41 and a test light-shielding structure SS_4b' formed on the dummy pixel PXb_d42. The fifth test pattern TP5' may include a test light-shielding structure SS_5a' formed on the dummy pixel PXb_d51 and a test light-shielding structure SS_5b' formed on the dummy pixel PXb_d52.

Upon examining the test light-shielding patterns formed on the first group dummy pixels PXb_d11 through PXb_d51, the test light-shielding structure SS_1a' may be formed on the entire dummy pixel PXb_d11, and the test light-shielding structures SS_2a' through SS_5a' may be formed to be spaced apart by distances Da', Db', Dc', and Dd' from a start line L1' of the test light-shielding structure SS_1a'. In an example embodiment, differences among the distances Da', Db', Dc', and Dd' may be the same as, or different from, one another. In detail, differences between the distances Db' and Da', between the distances Dc' and Db', and between the distances Dd' and Dc' may be the same as, or different from, another. That is, the test light-shielding patterns formed on the first group dummy pixels PXb_d11 through PXb_d51 may have a downward stepped shape in a right direction.

Upon examining the test light-shielding patterns formed on the second group dummy pixels PXb_d12 through PXb_d52, the test light-shielding structure SS_1b' may be formed on the entire dummy pixel PXb_d12, and the test light-shielding structures SS_2b' through SS_5b' may be formed to be spaced apart by the distances Da', Db', Dc', and Dd' from a start line L2' of the test light-shielding structure SS_1b'. That is, the test light-shielding patterns formed on the second group dummy pixels PXb_d12 through PXb_d52 may have a downward stepped shape in the right direction.

Also, the test light-shielding patterns formed on the first group dummy pixels PXb_d11 through PXb_d51 and the test light-shielding patterns formed on the second group dummy pixels PXb_d12 through PXb_d52 may be symmetric each other about a line L3' that contacts the first group dummy pixels PXb_d11 through PXb_d51 and the second group dummy pixels PXb_d12 through PXb_d52.

However, the test light-shielding patterns of FIG. 8B are exemplary, and the inventive concept is not limited thereto. In some example embodiments, the test light-shielding patterns may have any of various shapes according to the number of dummy pixels included in the second TEG TEG2. For example, the test light-shielding patterns may have a shape obtained by vertically inverting the test light-shielding patterns of FIG. 8B, or the test light-shielding patterns formed on the first group dummy pixels PXb_d11 through PXb_d51 and the test light-shielding patterns formed on the second group dummy pixels PXb_d12 through PXb_d52 may be asymmetric.

Referring to FIG. 8C, in comparison with the first TEG TEG1 of FIG. 8A, test light-shielding patterns formed on the first group dummy pixels PXa_d11 through PXa_d51 may be the same and test light-shielding patterns formed on the second group dummy pixels PXa_d12 through PXa_d52 may be different. In detail, upon examining test light-shielding patterns formed on the second group dummy pixels PXa_d12 through PXa_d52 of FIG. 8C, a test light-shielding structure SS_5b'' may be formed on the entire dummy pixel PXa_d52, and test light-shielding structures SS_4b'' through SS_1b'' may be formed to be spaced apart from the distances Da, Db, Dc, and Dd from the start line L2 of the test light-shielding structure SS_5b''. As a result, the test light-shielding patterns formed on the first TEG TEG1 may include the first through fifth test patterns TP1 through TP5 having the same width.

Figure 9A:
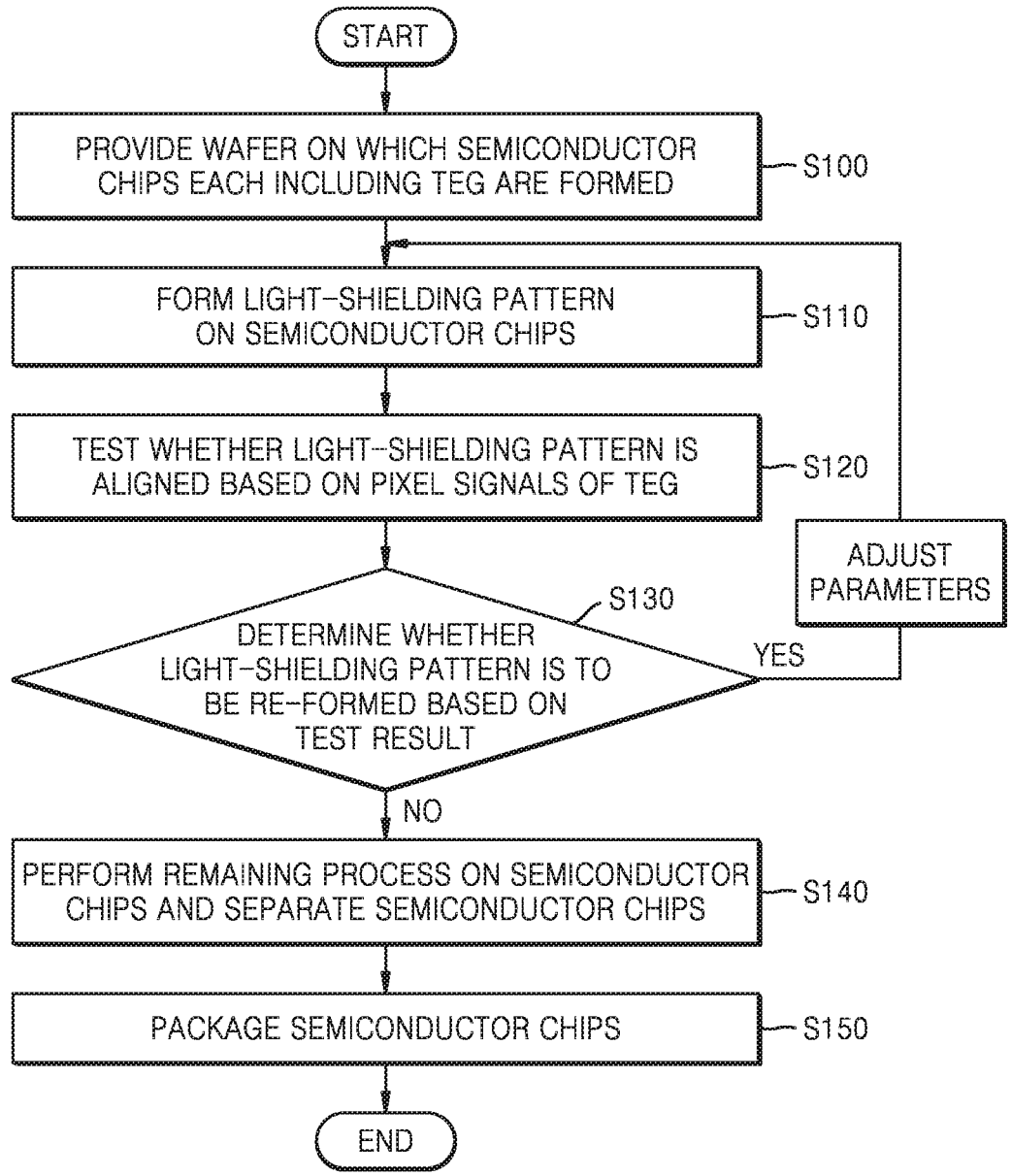
FIG. 9A is a flowchart of a method of manufacturing an image sensor chip package according to an example embodiment.
Figures 9B, 9C:
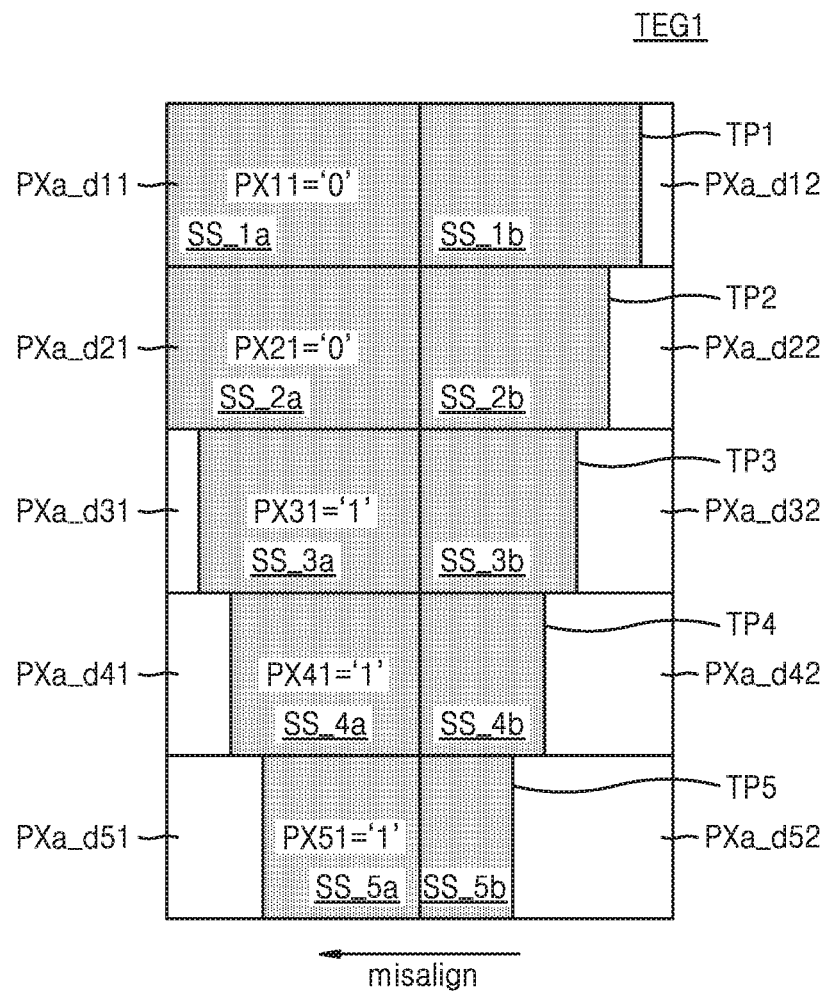
FIGS. 9B and 9C are views for explaining operations S120 and S130 of FIG. 9A.

FIG. 9A is a flowchart of a method of manufacturing an image sensor chip package, according to an example embodiment. FIGS. 9B and 9C are views for explaining operations S120 and S130 of FIG. 9A.

Referring to FIG. 9A, in operation S100, a wafer on which semiconductor chips each including at least one TEG including a plurality of dummy pixels are formed is provided. In operation S110, a light-shielding pattern is formed on active pixels of each of the semiconductor chips, and, also, a test light-shielding pattern according to an example embodiment is formed on the TEG of each of the semiconductor chips. Next, in operation S120, whether the light-shielding pattern of each of the semiconductor chips is aligned is tested based on pixel signals generated from the TEG of each of the semiconductor chips.

When the test light-shielding pattern of FIG. 8A is formed on the first TEG TEG1 of one semiconductor chip in operation S110, the test light-shielding pattern may be misaligned with the first TEG TEG1 as shown in FIG. 9B. Although the test light-shielding pattern formed on the first TEG TEG1 is shifted leftward in FIG. 9B, this is exemplary and the inventive concept is not limited thereto. In some example embodiments, the test light-shielding pattern formed on the first TEG TEG1 may be shifted rightward, upward, or downward.

Further referring to FIG. 9B, in operation S120, whether the light-shielding pattern and an active area of the semiconductor chip are aligned may be tested based on dummy pixel signals generated from the TEG TEG1. In detail, an existence of alignment between the active area and the light-shielding pattern of the semiconductor chip and, in the case of misalignment, a degree of misalignment between the active area and the light-shielding pattern may be detected based on dummy pixel signals PX11 through PX51 generated from the first group dummy pixels PXa_d11 through PXa_d51, respectively. Each dummy pixel signal may have '1' or a logic high value when light is detected, and may have '0' or a logic low value when light is not detected. For example, it may be found that when the dummy pixel signals PX11 through PX51 sequentially have '00111', due to misalignment of the test light-shielding pattern, the entire dummy pixel PXa_d21 is covered by the test light-shielding structure SS_2a. That is, although the test light-shielding structure SS_2a should be spaced apart by the distance Da from the line L1 as shown in FIG. 8A, the test light-shielding structure SS_2a is actually formed as shown in FIG. 9B, and thus the test light-shielding structure is misaligned leftward by an arbitrary distance between the distance 'Da' and the distance 'Db'. Since a misalignment tendency of the test light-shielding pattern is the same as or similar to a misalignment tendency of the light-shielding pattern, a degree of misalignment of the light-shielding pattern may be obtained by using a degree of misalignment of the test light-shielding pattern.

A table TB of FIG. 9C shows a degree of misalignment between the light-shielding pattern and the active area of the semiconductor chip (or between the test light-shielding pattern and the TEG) corresponding to each dummy pixel signal value. A degree of misalignment according to a dummy pixel signal value may be detected by referring to the table TB in operation S120. Also, in operation S120, when the degree of misalignment is equal to or greater than a threshold value, it may be determined that the active area of the semiconductor chip and the light-shielding pattern are misaligned with each other. For example, when the threshold value is the distance Da and the degree of misalignment is equal to or greater than the distance Da, it may be determined that the active area of the semiconductor chip and the light-shielding pattern are misaligned with each other.

Referring back to FIG. 9A, in operation S130, whether the light-shielding pattern is to be re-formed according to each semiconductor chip may be determined based on a test result. When it is determined in operation S130 that the light-shielding pattern is to be re-formed, the method may return to operation S110 in which the light-shielding pattern for the semiconductor chips is re-formed by adjusting light-shielding pattern forming parameters such as a position of the light-shielding pattern based on the degree of misalignment of the light-shielding pattern (or the degree of misalignment of the test light-shielding pattern) detected according to each semiconductor chip. When it is determined in operation S130 that the light-shielding pattern is not to be re-formed, the method may proceed to operation S140. In operation S140, a remaining process may be performed on the semiconductor chips and the semiconductor chips may be separated. Next, in operation S150, an image sensor chip package may be generated by packing each of the separated semiconductor chips.

Figure 10A:
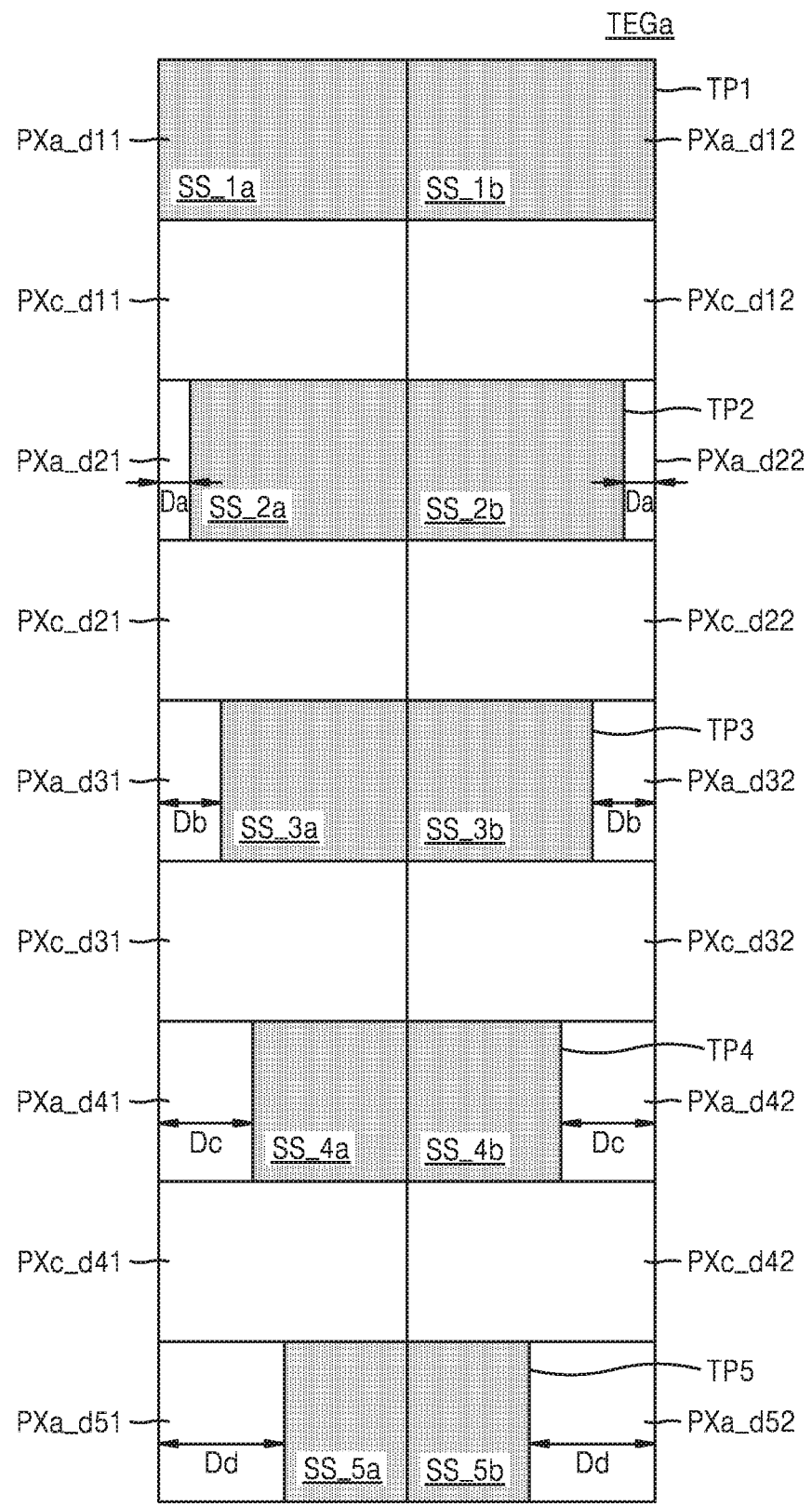
FIGS. 10A through 10C are views for explaining various test light-shielding patterns according to an example embodiment.
Figure 10B:
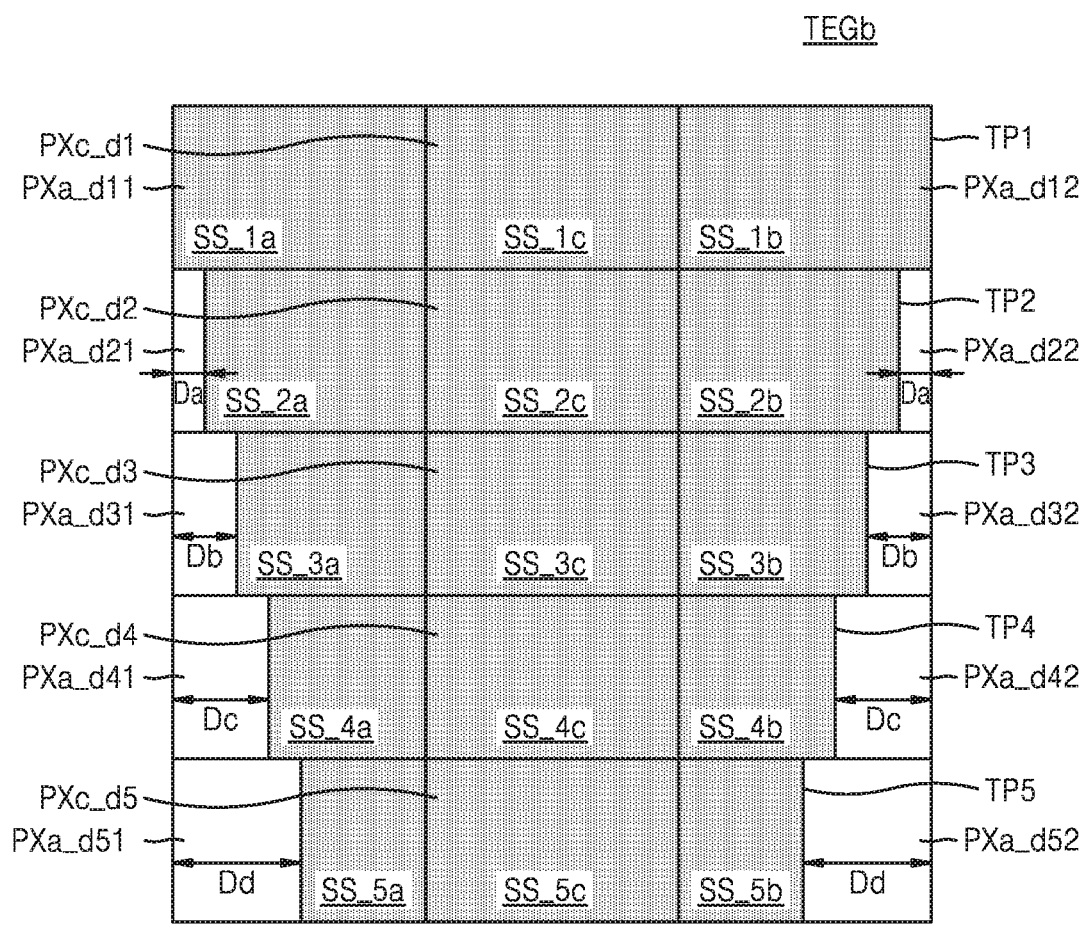
Figure 10C:
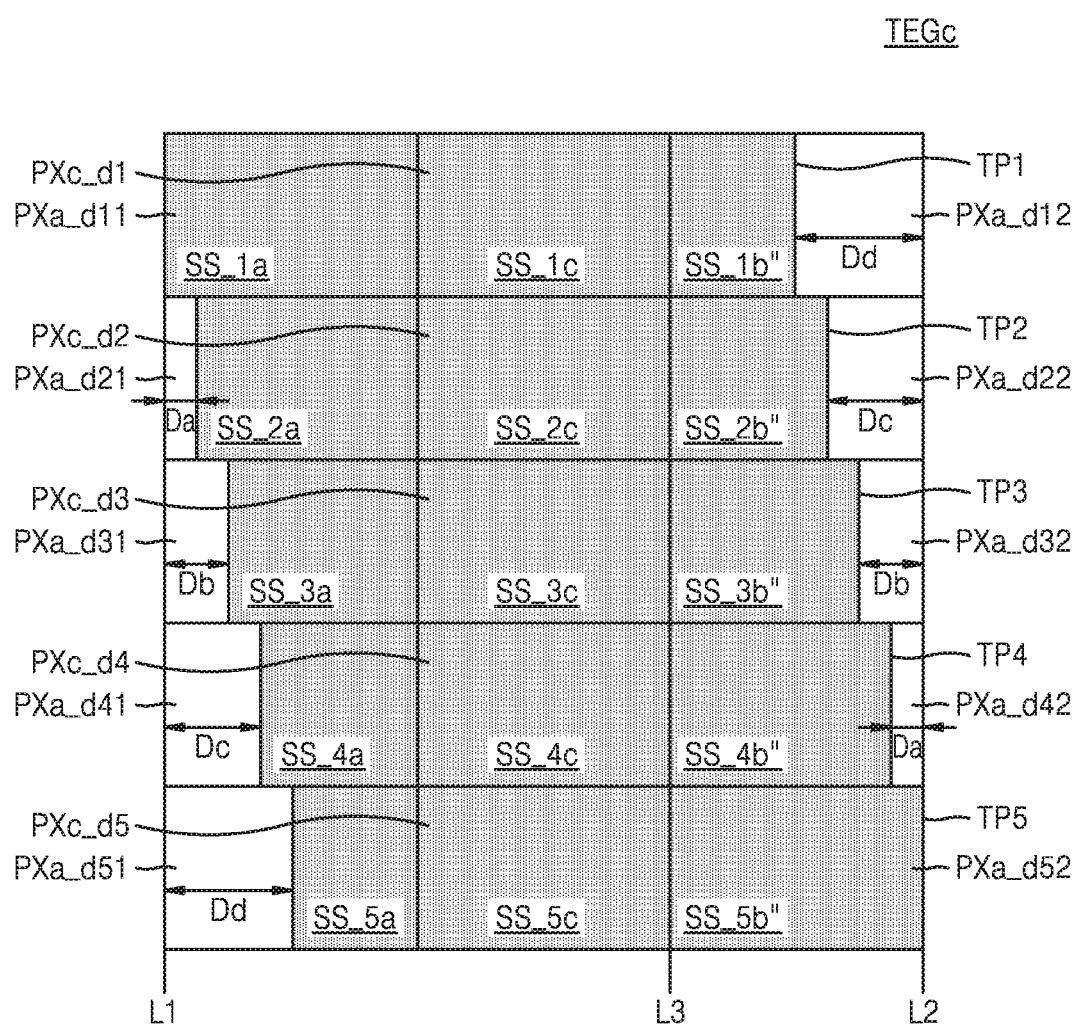

FIGS. 10A through 10C are views for explaining various test light-shielding patterns according to example embodiments.

Referring to FIG. 10A, a test light-shielding structure may be omitted (i.e., not formed) on an area corresponding to at least one dummy pixel included in a TEG TEGa according to an example embodiment. In detail, compared to the first TEG TEG1 of FIG. 8A, the TEG TEGa may further include dummy pixels PXc_d11, PXc_d21, PXc_d31, PXc_d41, PXc_d51, PXc_d12, PXc_d22, PXc_d32, PXc_d42, and PXc_d52 on which a test light-shielding structure is not formed.

Referring to FIG. 10B, a test light-shielding structure may be formed on an entire area corresponding to at least one dummy pixel included in a TEG TEGb according to an example embodiment. In detail, when compared with the first TEG TEG1 of FIG. 8A, the TEG TEGb may further include dummy pixels PXc_d1, PXc_d2, PXc_d3, PXc_d4, and PXc_d5 on which a test light-shielding structure is entirely formed.

Referring to FIG. 10C, a test light-shielding structure may be formed on an entire area corresponding to at least one dummy pixel included in a TEG TEGc according to an example embodiment. In detail, when compared with the first TEG TEG1 of FIG. 8C, the TEG TEGc may further include the dummy pixels PXc_dl through PXc_d5 on which a test light-shielding structure is entirely formed.

FIGS. 10A through 10C are exemplary, and the inventive concept is not limited thereto. In some example embodiments, a test light-shielding pattern having any of various shapes may be configured to rapidly and accurately detect a degree of misalignment between an active area and a light-shielding pattern.

Figure 11A:
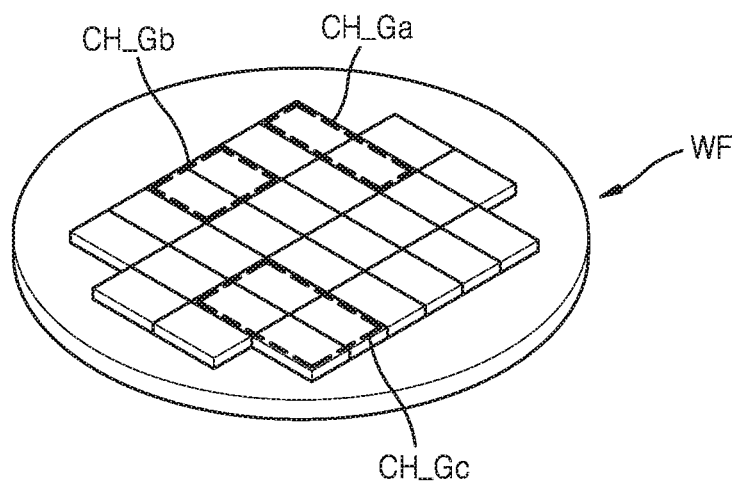
FIGS. 11A and 11B are views for explaining a step of forming and re-forming a light-shielding pattern during a process of manufacturing an image sensor chip package according to an example embodiment.
Figure 11B:
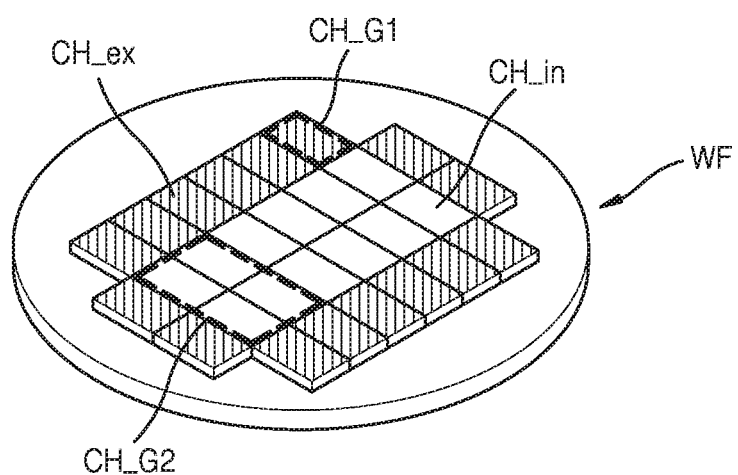

FIGS. 11A and 11B are views for explaining a step of forming and re-forming a light-shielding pattern during a process of manufacturing an image sensor chip package according to an example embodiment.

Referring to FIGS. 9A and 11A, the plurality of semiconductor chips CH may be arranged on one surface of the wafer WF in a 2D manner, and operation S110 may be performed on any one from among a first chip group unit CH_Ga, a second chip group unit CH_Gb, and a third chip group unit CH_Gc. For example, operation S110 may be performed based on the same light-shielding pattern forming parameters on a first semiconductor chip and a second semiconductor chip included in the first chip group unit CH_Ga.

Operations S120 and S130 may be performed on any one from among the first chip group unit CH_Ga, the second chip group unit CH_Gb, and the third chip group unit CH_Gc. For example, whether a light-shielding pattern is aligned may be tested on the first chip group unit CH_Ga by using dummy pixel signals of a TEG formed on each of the first semiconductor chip and the second semiconductor chip included in the first chip group unit CH_Ga, and whether to re-form a light-shielding pattern may be determined based on a test result. Furthermore, a step of re-forming the light-shielding pattern may be performed by using the dummy pixel signals of the TEG formed on each of the first semiconductor chip and the second semiconductor chip. However, the first chip group unit CH_Ga, the second chip group unit CH_Gb, and the third chip group unit CH_Gc of FIG. 11A are exemplary, and the inventive concept is not limited thereto and operations S110 through S130 may be performed on more various chip group units.

Referring to FIG. 11B, the semiconductor chips CH arranged on one surface of the wafer WF may be divided into outer semiconductor chips CH_ex located on an outer portion and inner semiconductor chips CH_in located on an inner portion. When operations S110 through S130 are performed on the outer semiconductor chips CH_ex according to an example embodiment, operations S110 through S130 may be performed according to each semiconductor chip unit CH_G1; and when operations S110 through S130 are performed on the inner semiconductor chips CH_in, operations S110 through S130 may be performed according to each chip group unit CH_G2 including a predetermined number of semiconductor chips.

Figure 12:
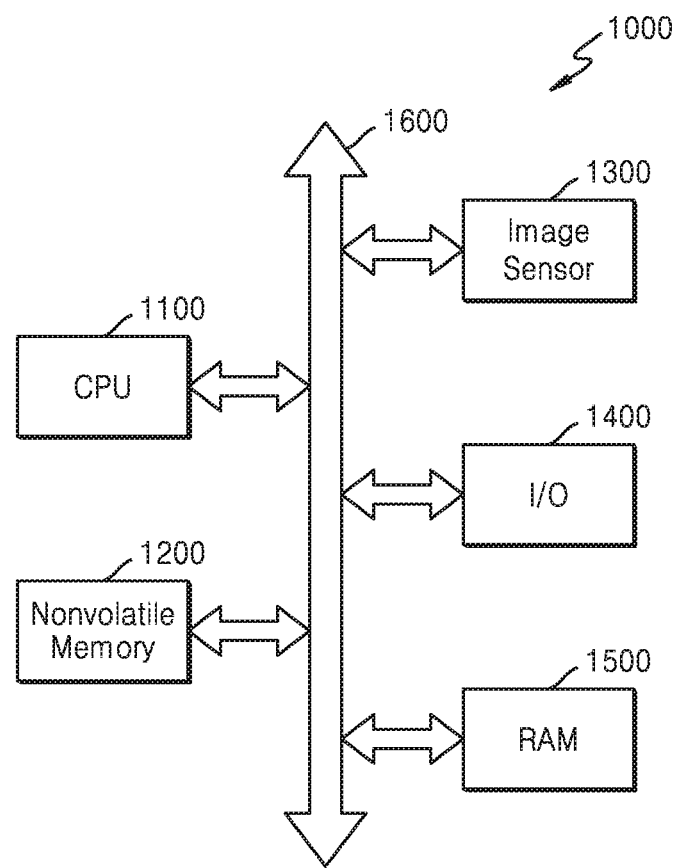
FIG. 12 is a block diagram of a system including an image sensor according to an example embodiment.

FIG. 12 is a block diagram of a system 1000 including an image sensor 1300 according to an example embodiment.

Referring to FIG. 12, the system 1000 may be any one of a computing system, a camera system, a scanner, a vehicle navigation system, a video phone, a security system, and a motion detection system that require image data.

As shown in FIG. 12, the system 1000 may include a central processing unit (CPU) (or a processor) 1100, a nonvolatile memory 1200, the image sensor 1300, an input/output device 1400, and random-access memory (RAM) 1500. The CPU 1100 may communicate with the nonvolatile memory 1200, the image sensor 1300, the input/output device 1400, and the RAM 1500 via a bus 1600. The image sensor 1300 may be implemented as an independent semiconductor chip, or may be implemented as one semiconductor chip by being combined with the CPU 1100. The image sensor 1300 may be implemented according to example embodiments of FIGS. 1 through 11B.

The CPU 1100 may control the system 1000, and may transmit/receive data to/from other elements through the bus 1600. For example, the CPU 1100 may receive data generated by the image sensor 1300 according to an example embodiment. The nonvolatile memory 1200 that retains stored data even when power is shut off may store data generated by the image sensor 1300 or data obtained after processing the generated data. The RAM 1500 may function as a data memory of the CPU 1100, and may be a volatile memory device. The input/output device 1400 may receive a command from a user or may output a video and/or an audio to the user.

Figure 13:
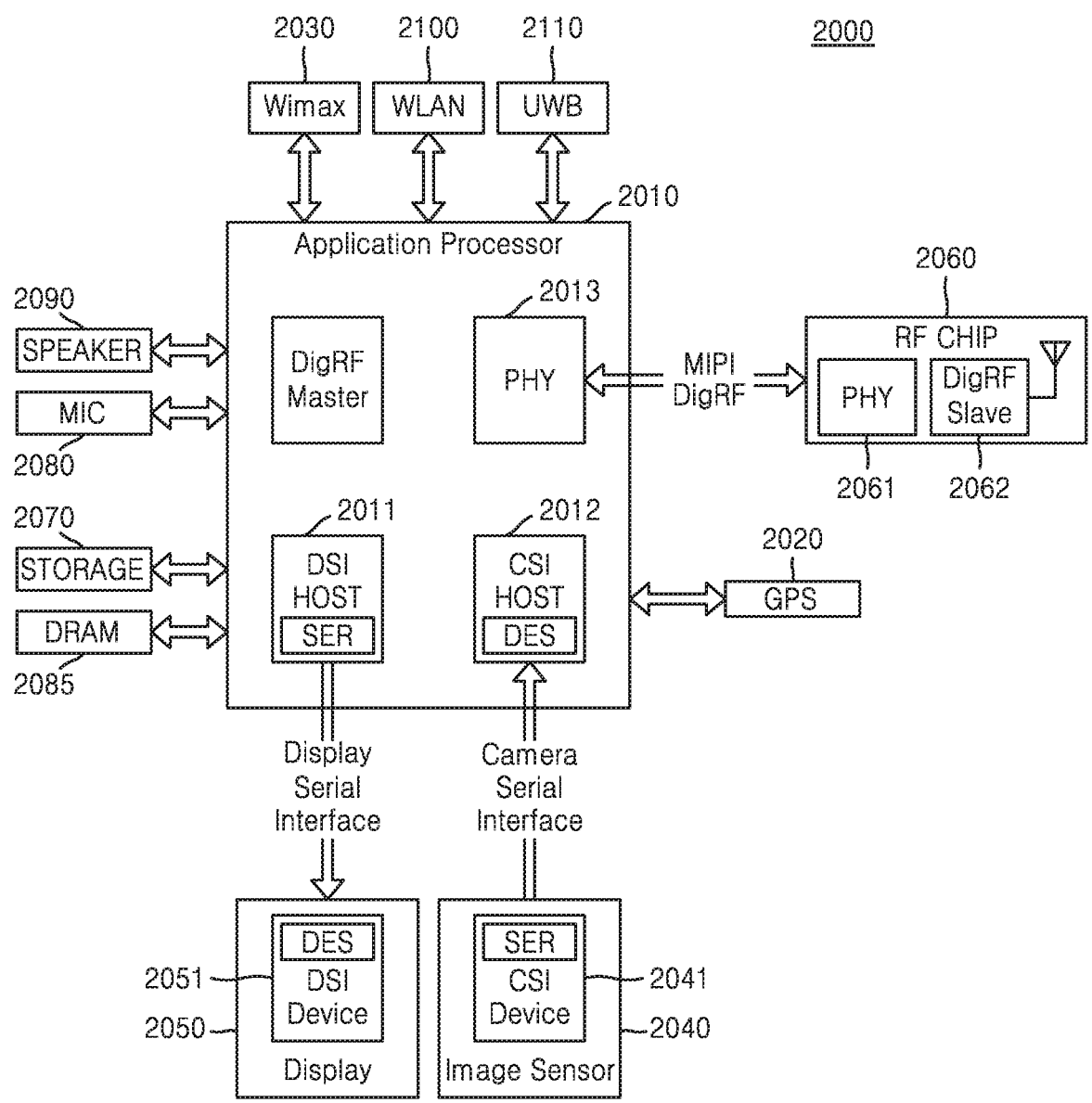
FIG. 13 is a block diagram illustrating an electronic system including an image sensor and an interface according to an example embodiment.

FIG. 13 is a block diagram illustrating an electronic system 2000 including an image sensor 2040 and an interface according to an example embodiment.

Referring to FIG. 13, the electronic system 2000 may be a data processing device that may use or support a MIPI interface, for example, a mobile phone, a personal digital assistant (PDA), a personal medial player (PMP), or a smartphone. The electronic system 2000 may include an application processor 2010, the image sensor 2040 and a display 2050. The image sensor 2040 may be implemented according to example embodiments of FIGS. 1 through 11B.

A camera serial interface (CSI) host 2012 in the application processor 2010 may sequentially communicate with a CSI device 2041 of the image sensor 2040 through a CSI. In this case, an optical deserializer may be implemented in the CSI host 2012, and an optical serializer may be implemented in the CSI device 2041.

A display serial interface (DSI) host 2011 in the application processor 2010 may sequentially communicate with a DSI device 2051 of the display 2050 through a DSI. In this case, for example, an optical serializer may be implemented in the DSI host 2011, and an optical deserializer may be implemented in the DSI device 2051.

The electronic system 2000 may further include a radio frequency (RF) chip 2060 that may communicate with the application processor 2010. A PHY 2013 of the electronic system 2000 and a PHY 2061 of the RF chip 2060 may transmit/receive data according to MIPI DigRF. The electronic system 2000 may further include a global positioning system (GPS) 2020, a storage 2070, a microphone 2080, a dynamic random-access memory (DRAM) 2085, and a speaker 2090, and may communicate by using a worldwide interoperability for microwave access (WiMAX) 2030, a wireless local area network (WLAN) 2100, and an ultra-wideband (UWB) 2110.

An image sensor and stacked image sensors according to the one or more example embodiments may be implemented in any of various packages. For example, at least some elements of an integrated circuit may be mounted by using a package such as package on package (PoP), ball grid array (BGA), chip-scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi-chip package (MCP), wafer-level fabricated package (WFP), or wafer-level processed stack package (WSP).

While the inventive concept has been particularly shown and described with reference to example embodiments thereof, it will be understood that various changes in form and details may be made therein without departing from the spirit and scope of the following claims. Accordingly, the true technical scope of the inventive concept is defined by the technical spirit of the appended claims.

What is claimed is:

1. An image sensor comprising:
   a pixel array comprising an active area in which a plurality of active pixels are located, and a dummy area in which a plurality of dummy pixels are located; and
   at least one test element group (TEG) which is located in the dummy area and on which a test light-shielding pattern, different from a light-shielding pattern formed on the active area, is formed to detect a degree of misalignment between the light-shielding pattern and the active area,
   wherein:
   the at least one TEG is located adjacent to at least one of a left side and a right side of the active area,
   the at least one TEG comprises a plurality of first group dummy pixels from among the plurality of dummy pixels, the plurality of first group dummy pixels comprising a first dummy pixel, a second dummy pixel and a third dummy pixel located adjacent to at an upper side or a lower side of the at least one TEG,
   the test light-shielding pattern comprises a first test light-shielding pattern having a stepped shape in an up or down direction of the at least one TEG that is formed on the plurality of first group dummy pixels,
   the first test light-shielding pattern comprises a first test light-shielding structure formed on the first dummy pixel, a second test light-shielding structure formed on the second dummy pixel, and a third test light-shielding structure formed on the third dummy pixel, and
   the second test light-shielding structure is spaced apart by a first distance in a left or right direction of the at least one TEG from a first start line of the first light-shielding structure, and the third test light-shielding structure is spaced apart by a second distance in the left or right direction of the at least one TEG from a second start line of the second test light-shielding structure.

2. The image sensor of claim 1, wherein the first distance and the second distance are the same as, or different from, each other.

3. The image sensor of claim 1, wherein the at least one TEG further comprises a plurality of second group dummy pixels from among the plurality of dummy pixels, the plurality of second group dummy pixels being adjacent in the left or right direction of the at least one TEG to the plurality of first group dummy pixels,
wherein the test light-shielding pattern comprises a second test light-shielding pattern that is formed on the plurality of second group dummy pixels, the second test light-shielding pattern being symmetric with the first test light-shielding pattern about a line that contacts the plurality of first group dummy pixels.

4. The image sensor of claim 1, wherein the at least one TEG is located adjacent to at least one of an upper side and a lower side of the active area.

5. The image sensor of claim 1, wherein the at least one TEG comprises a first TEG and a second TEG, and
the first TEG is adjacent to at least one of the left side and the right side of the active area and the second TEG is adjacent to at least one of an upper side and a lower side of the active area.

6. The image sensor of claim 5, wherein the first TEG and the second TEG are located adjacent to each other.

7. The image sensor of claim 5, wherein a first number of dummy pixels included in the first TEG and a second number of dummy pixels included in the second TEG are the same as, or different from, each other.

8. The image sensor of claim 1, wherein the test light-shielding pattern is not formed on an area corresponding to at least one dummy pixel included in the at least one TEG.

9. The image sensor of claim 1, wherein the test light-shielding pattern is formed on an entire area corresponding to at least one dummy pixel included in the at least one TEG.

10. An imaging device comprising:
an image sensor comprising a pixel array comprising at least one test element group (TEG) on which a test light-shielding pattern, different from a light-shielding pattern formed on a plurality of active pixels, is formed to detect a degree of misalignment between the plurality of active pixels and the light-shielding pattern; and
an image signal processor configured to receive a plurality of accumulated charges from a plurality of photodiodes of the plurality of active pixels, and perform image processing on the plurality of accumulated charges,
wherein:
the at least one TEG is located adjacent to at least one of a left side and a right side of an active area,
the at least one TEG comprises a plurality of first group dummy pixels from among a plurality of dummy pixels, the plurality of first group dummy pixels comprising a first dummy pixel, a second dummy pixel and a third dummy pixel located adjacent to at an upper side or a lower side of the at least one TEG,
the test light-shielding pattern comprises a first test light-shielding pattern having a stepped shape in an up or down direction of the at least one TEG that is formed on the plurality of first group dummy pixels,
the first test light-shielding pattern comprises a first test light-shielding structure formed on the first dummy pixel, a second test light-shielding structure formed on the second dummy pixel, and a third test light-shielding structure formed on the third dummy pixel, and
the second test light-shielding structure is spaced apart by a first distance in a left or right direction of the at least one TEG from a first start line of the first test light-shielding structure, and the third test light-shielding structure is spaced apart by a second distance in the left or right direction of the at least one TEG from a second start line of the second test light-shielding structure.

11. The imaging device of claim 10, wherein the plurality of first group dummy pixels are for detecting the degree of misalignment of the light-shielding pattern.

12. The imaging device of claim 10, wherein the image signal processor is further configured to receive a plurality of pixel signals from the at least one TEG, detect a plurality of states of the plurality of active pixels based on the plurality of pixel signals, and perform the image processing based on the plurality of states that are detected.

13. A method of manufacturing an image sensor chip package, the method comprising:
providing a wafer on which a plurality of semiconductor chips, each comprising at least one test element group (TEG) including a plurality of dummy pixels are formed;
forming a light-shielding pattern on a plurality of active pixels of each of the plurality of semiconductor chips, and forming a test light-shielding pattern on the at least one TEG of each of the plurality of semiconductor chips;
testing whether the light-shielding pattern of each of the plurality of semiconductor chips is aligned based on a plurality of pixel signals generated from the at least one TEG of each of the plurality of semiconductor chips;
for any of the plurality of semiconductor chips on which the light-shielding pattern is not aligned, re-forming the light-shielding pattern of the semiconductor chip according to a test result;
providing an individual image sensor chip by separating the plurality of semiconductor chips from the wafer; and
packaging the individual image sensor chip,
wherein:
the at least one TEG is located adjacent to at least one of a left side and a right side of an active area,
the at least one TEG comprises a plurality of first group dummy pixels from among the plurality of dummy pixels, the plurality of first group dummy pixels comprising a first dummy pixel, a second dummy pixel and a third dummy pixel located adjacent to at an upper side or a lower side of the at least one TEG,
the test light-shielding pattern comprises a first test light-shielding pattern having a stepped shape in an up or down direction of the at least one TEG that is formed on the plurality of first group dummy pixels,
the first test light-shielding pattern comprises a first test light-shielding structure formed on the first dummy pixel, a second test light-shielding structure formed on the second dummy pixel, and a third test light-shielding structure formed on the third dummy pixel, and
the second test light-shielding structure is spaced apart by a first distance in a left or right direction of the at least one TEG from a first start line of the first test light-shielding structure, and the third test light-shielding structure is spaced apart by a second distance in the left or right direction of the at least one TEG from a second start line of the second test light-shielding structure.

14. The method of claim 13, wherein the plurality of first group dummy pixels are for detecting a first degree of misalignment of the light-shielding pattern with respect to a first side, and the at least one TEG includes a plurality of second group dummy pixels for detecting a second degree of misalignment of the light-shielding pattern with respect to a second side, wherein the first test light-shielding pattern includes a plurality of the first test light-shielding structures whose areas are different according to the plurality of first group dummy pixels, and a plurality of the second test light-shielding structures whose areas are different according to the plurality of second group dummy pixels.

15. The method of claim 13, wherein the testing whether the light-shielding pattern is aligned comprises detecting a degree of misalignment of the light-shielding pattern according to each of the plurality of semiconductor chips based on the plurality of pixel signals generated from the at least one TEG of each of the plurality of semiconductor chips.

16. The method of claim 15, wherein the light-shielding pattern is re-formed by adjusting a position of the light-shielding pattern of the plurality of semiconductor chips based on the degree of misalignment.

* * * * *